US006462956B1

(12) United States Patent (10) Patent No.: US 6,462,956 B1
Herrell et al. (45) Date of Patent: Oct. 8, 2002

(54) ARRANGEMENT FOR REDUCING NON-UNIFORMITY IN CURRENT FLOW THROUGH VARIOUS POWER PINS WITHIN A PRINTED WIRING BOARD CONNECTOR FOR A REMOVABLE MODULE

(75) Inventors: Dennis J. Herrell, Marble Falls; Thomas P. Dolbear, Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/635,333

(22) Filed: Aug. 9, 2000

(51) Int. Cl.$^7$ .................................................. H05K 7/10
(52) U.S. Cl. ........................ 361/777; 361/788; 361/780; 361/794; 174/261; 174/255; 710/301
(58) Field of Search .................................. 361/777, 779, 361/794, 720, 760, 761, 736, 746, 748, 750, 780, 788; 257/691; 710/301; 174/261, 255

(56) References Cited

U.S. PATENT DOCUMENTS

| 4,223,179 | A |   | 9/1980  | Lusk et al. ................. 174/73.1 |
| 4,316,159 | A |   | 2/1982  | Ho ............................ 333/101 |
| 5,250,844 | A |   | 10/1993 | Smith ......................... 257/695 |
| 5,520,683 | A |   | 5/1996  | Subramaniam et al. ....... 606/32 |
| 5,682,298 | A |   | 10/1997 | Raynham .................... 361/794 |
| 5,757,171 | A | * | 5/1998  | Babcock ..................... 323/271 |
| 6,198,635 | B1| * | 3/2001  | Shenoy et al. .............. 361/760 |

OTHER PUBLICATIONS

Herrell, Dennis J., "Power to the Package," *IEEE Spectrum*, Jul. 1999, 9 pp.
U.S. Patent Application entitled "Integrated Circuit Carrier Arrangement for Reducing Non-Uniformity in Current Flow Through Power Pins," filed Aug. 9, 2000, Attorney Docket No. 1001–0086, naming inventors Dennis J. Herrell and Thomas J. Hirsch, which is assigned to the assignee of the present invention, 47 pp.

* cited by examiner

Primary Examiner—David Martin
Assistant Examiner—Hung Bui
(74) Attorney, Agent, or Firm—Zagorin, O'Brien & Graham, L.L.P.

(57) ABSTRACT

An arrangement for a motherboard having a connector for a removable module is disclosed which increases the aggregate current carrying capacity of the connector by reducing the difference in current flow between power pins of the connector having the highest current flow and power pins of the connector having the lowest current flow. The current flow through all the power pins may then be operated nearer to the design maximum of the particular connector used. Thicker power planes within the motherboard (as well as within the module) reduce the effective resistance per square of the power plane, and help distribute the current more uniformly to a greater number of power pins of the connector. The use of multiple power planes in parallel also achieves a lower effective resistance. Multiple power terminals connecting the source of regulated power supply voltage (or reference voltage, such as ground) to the power plane may be used instead of just one power terminal. Moreover, placing a pair of power terminals symmetrically about a line perpendicular to the connector which bisects the power pins of the connector helps distribute the current flow through the power plane to the power pins. By placing the power terminal (or terminals) at least a certain distance from the connector (e.g., at least 15 mm), a more uniform current flow through the connector is achieved.

45 Claims, 20 Drawing Sheets

FIG. 4

```
    #  _ _ _ _ _ _ _ _ _ _ _ _ _ _ _ _ _ _ _ _ _ _ _ _  #
    0  5 # # # # # # # # # # # # # # # # # # # # # # # #
 0
 5     9 9 9 9 9 9 # # # # # # # # # # # # # 9 9 9 9 9 9       GRID
10     9 9 9 9 9 9 # # # # # # # # # # # # # 9 9 9 9 9 9       REPRESENTATION
15     9 9 9 9 9 9 9 # # # # # # # # # # # 9 9 9 9 9 9 9       OF POTENTIALS ON
20     9 9 9 9 9 9 9 # # # # # # # # # # # 9 9 9 9 9 9 9       SURFACE OF CARD
25     9 9 9 9 9 9 9 # # # # # # # # # # 9 9 9 9 9 9 9 9       VCC PLANE
30     9 9 9 9 9 9 9 9 # # # # # # # # # 9 9 9 9 9 9 9 9
35     9 9 9 9 9 9 9 9 # # # # # # # # 9 9 9 9 9 9 9 9 9
40     9 9 9 9 9 9 9 9 9 # # # # # 9 9 9 9 9 9 9 9 9 9 9
45     9 9 9 9 9 9 9 9 9 9 9 9 9 9 9 9 9 9 9 9 9 9 9 9 9
50     9 9 9 9 9 9 9 9 9 9 9 9 9 9 9 9 9 9 9 9 9 9 9 9 9
       2 1 2 3 2 3 1 3 1 0 3 2 3 1 3 1 3 1 3 0 2 0 2 0 1   ←145
                                                              SLOT ONE
 0                                                            CONNECTOR
 5     -0 -0 -0 -0 -0 -0 -0 -0 -0 -0 -0 -0 -0 -0 -0 -0 -0 -0 -0 -0 -0 -0 -0 -0 -0   LOCATION
10     -0 -0 -0 -0 -0 -0 -0 -0 -0 -0 -0 -0 -0 -0 -0 -0 -0 -0 -0 -0 -0 -0 -0 -0 -0
15     -0 -0 -0 -0 -0 -0 -0 -0 -0 -0 -0 -0 -0 -0 -0  0  0  0  0  0  0  0  0  0  0
20     -0 -0 -0 -0 -0 -0 -0 -0 -0 -0 -0 -0 -0 -0 -0  0  0  0  0  0  0  0  0  0  0
25     -0 -0 -0 -0 -0 -0 -0 -0 -0 -0 -0 -0 -0 -0 -0  1  0  0  0  0  0  0  0  0  1
30     -0 -0 -0 -0 -0 -0 -0 -0 -0 -0 -0 -0 -0  1  1  0  0  0  0  0  0  1  1  1  1
35     -0 -0 -0 -0 -0 -0 -0  2  2  3  3  2  2  1  1  0  0  1  1  1  1  1  1  1  1    ←126
40      5  5  5  5  5  5  5  4  4  3  3  3  2  2  1  0  1  1  1  1  1  1  1  1  1
45      5  5  5  5  5  5  5  4  4  4  3  3  2  2  2  1  1  1  1  2  2  2  2  2  2
50      5  5  5  5  5  5  5  4  4  4  3  3  2  2  2  2  2  2  3  3  3  3  4            ←144
55      5  5  5  5  5  5  5  4  4  4  3  3  3  2  2  2  2  2  2  3  2  2  2
60      5  5  5  5  5  5  5  4  4  4  3  3  3  3  2  1  1  1  1 -0 -0 -0 -0
65      5  5  5  5  5  5  5  4  4  4  3  3  3  3 -0 -0 -0 -0 -0 -0 -0 -0 -0
70      3  3  2  2  2  2  2  2  2  2  2  1  1 -0 -0 -0 -0 -0 -0 -0 -0 -0 -0
75     -0 -0 -0 -0 -0 -0 -0 -0 -0 -0 -0 -0 -0 -0 -0 -0 -0 -0 -0 -0 -0 -0 -0 -0 -0
80     -0 -0 -0 -0 -0 -0 -0 -0 -0 -0 -0 -0 -0 -0 -0 -0 -0 -0 -0 -0 -0 -0 -0 -0 -0
85     -0 -0 -0 -0 -0 -0 -0 -0 -0 -0 -0 -0 -0 -0 -0 -0 -0 -0 -0 -0 -0 -0 -0 -0 -0
90     -0 -0 -0 -0 -0 -0 -0 -0 -0 -0 -0 -0 -0 -0 -0 -0 -0 -0 -0 -0 -0 -0 -0 -0 -0
95     -0 -0 -0 -0 -0 -0 -0 -0 -0 -0 -0 -0 -0 -0 -0 -0 -0 -0 -0 -0 -0 -0 -0 -0 -0
100    -0 -0 -0 -0 -0 -0 -0 -0 -0 -0 -0 -0 -0 -0 -0 -0 -0 -0 -0 -0 -0 -0 -0 -0 -0
105    -0 -0 -0 -0 -0 -0 -0 -0 -0 -0 -0 -0 -0 -0 -0 -0 -0 -0 -0 -0 -0 -0 -0 -0 -0
```

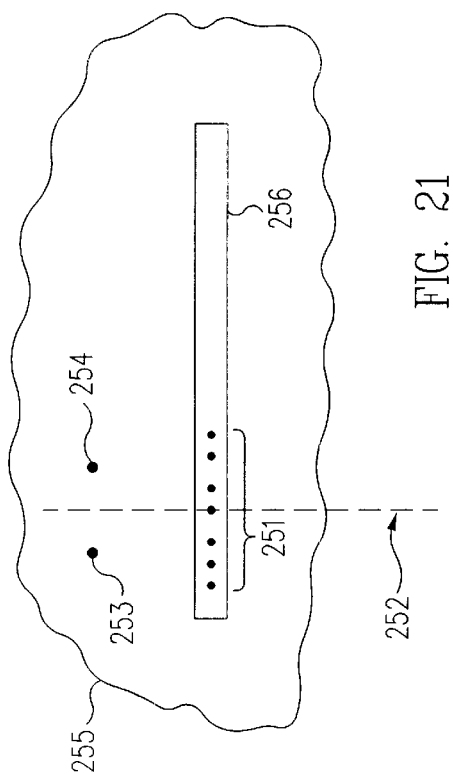
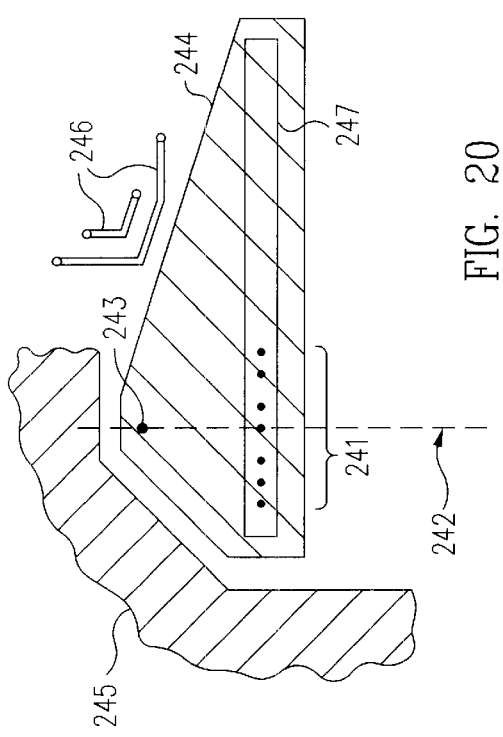
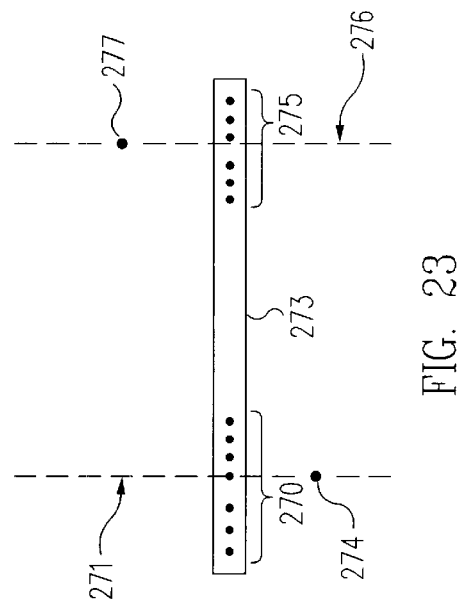

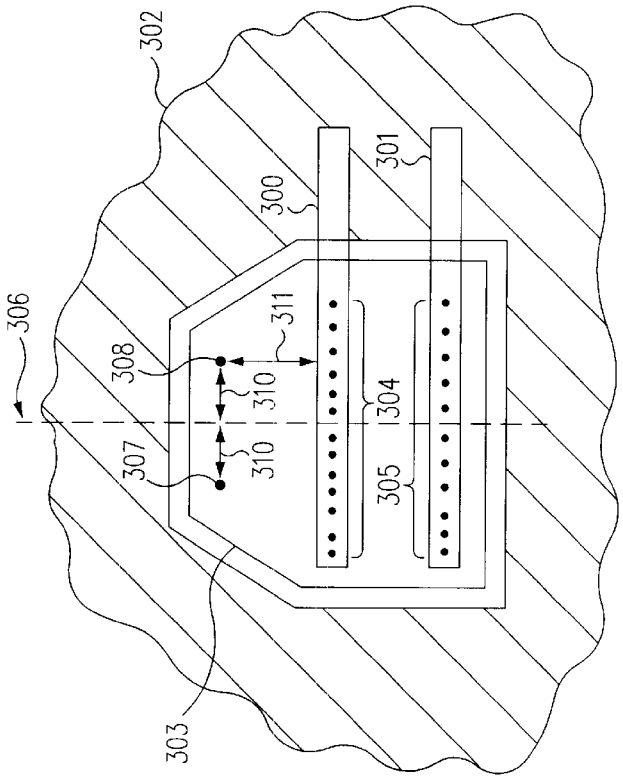
FIG. 25
FIG. 24
FIG. 26

ARRANGEMENT FOR REDUCING NON-UNIFORMITY IN CURRENT FLOW THROUGH VARIOUS POWER PINS WITHIN A PRINTED WIRING BOARD CONNECTOR FOR A REMOVABLE MODULE

BACKGROUND OF THE INVENTION

1. Field of the Invention

The present invention relates to power pins of a connector on a printed wiring board for receiving a removable module, and particularly relates to reducing non-uniformity in current flowing through the various power pins of such a connector.

2. Description of the Related Art

A motherboard is well understood to be a printed wiring board which includes at least one socket or connector into which a smaller printed wiring board or a packaged component is inserted. Frequently, the motherboard within an electronic system is the main circuit board and may also be the largest circuit board within the system. As is well known in the art, motherboards usually include multiple wiring layers for making interconnections between the various components attached thereto. In its simplest form, a printed wiring board need only include one wiring layer, but most motherboards usually include several wiring layers. For example, four wiring layers are commonly used, two of which are internal layers of the printed wiring board, and the other two wiring layers are formed on the outside two surfaces of the printed wiring board. In other cases, motherboards may include a number of wiring layers far greater than four, but for cost reasons, four wiring layers are frequently encountered in reasonably low cost motherboards.

One or more of these wiring layers may be arranged to provide one or more large planar conductive areas, or "planes", within the layer. Such conductive planes provide an effective way to convey power supply voltages (as well as a "ground" or other reference voltage) to the leads of integrated circuits, components, and connectors attached to the printed wiring board in a manner that has both low impedance and low inductance. These conductive planes are frequently called "power planes" irrespective of whether an actual "power supply" voltage, a "ground" reference voltage, an analog reference voltage, or some other voltage is actually conveyed on the conductive plane. As used herein, the term "power plane" should not be viewed as suggesting that a "power supply" voltage need be conveyed on such a power plane. In some cases, an entire wiring layer is utilized to provide a conductive plane for a particular power supply voltage or-ground potential. In other cases, a portion of a wiring layer is used to provide a conductive plane in a region of the board. This is particularly effective when multiple voltages are routed to different sections of the motherboard.

At least one connector is usually associated with the motherboard which provides a way to attach a removable module to the motherboard. Frequently, more than one connector may be provided on a single motherboard. Examples of commonly encountered removable modules include a CPU module, a DIMM memory module, a graphics processor module, as well as other removable sub-circuits implemented as removable cards. Examples of such cards include ISA-bus cards, PCI-bus cards, and others. The magnitude of the current flowing through each of the power pins of the connector is of particular importance whenever a removable module is inserted in a connector attached to a motherboard. Most connectors, by design, limit the magnitude of current flowing through each such pin to a particular value. In some cases, modem connectors are limited to no more than one ampere (i.e., 1 A) of current per connector pin. In the case of modem CPU modules, the total current consumed by the module may easily be upwards of 30 amps. Even with a large number of pins within the connector allocated as power pins for a given power supply or ground connection to a power plane, the design of both the motherboard and the module must ensure that each such power pin conducts a current no higher than the design limit for the particular connector utilized.

While such maximum current flow limits may be problematic for many kinds of removable modules, the problems are particularly worrisome in the case of modem CPU modules, where the amount of current consumed by the module is typically so much greater than with other kinds of removable modules. Previously, most removable modules consumed much less power than is consumed by many of the modern removable modules, and the current limitations per connector pin were rarely exceeded, even when scant attention was paid to the amount of current flowing through each power pin. However, as removable modules conducting far higher currents than in the past are more widely utilized, additional care is needed to ensure that the maximum current per connector pin is not exceeded.

In spite of the long history of motherboards which accommodate removable modules, the particular problems of high current through connector power pins are relatively new, and are getting worse with each new generation of microprocessors. Consequently, there is still a need for improvements in motherboard and module design.

SUMMARY OF THE INVENTION

The aggregate current carrying capacity of a connector may be increased by reducing the difference in current flow between power pins of the connector having the highest current flow and power pins of the connector having the lowest current flow. The current flow through all the power pins may then be operated nearer to the design maximum of the particular connector used.

In a motherboard having a connector for receiving a removable module, these objectives may be achieved by incorporating one or more of the following improvements into its design. Thicker power planes within the motherboard (as well as within the module) reduce the effective resistance per square of the power plane, and help distribute the current more evenly to a greater number of power pins of the connector. The use of multiple power planes in parallel also achieves a lower effective resistance. Multiple power terminals connecting the source of regulated power supply voltage to the power plane may be used instead of just one power terminal, for both power and ground power planes. Moreover, placing a pair of power terminals symmetrically about a line perpendicular to the connector and bisecting a particular group of power pins of the connector helps distribute the current flow through the power plane to the particular group of power pins. By placing the power terminal (or terminals) at least a certain distance from the connector (e.g., at least 15 mm), a more uniform current flow through the connector is also achieved.

The power terminals connecting to the power planes may be arranged to receive a cabled connector conveying a voltage from a source external to the motherboard. In other cases the power terminals may be arranged to connect to an output terminal of an on-motherboard voltage regulator. If the power pins of the connector are generally uniformly distributed along the connector, the perpendicular bisector of the group of power pins is aligned with the perpendicular bisector of the connector, and a pair of power terminals may be symmetrically arranged about the perpendicular bisector of the connector. Alternatively, a single power terminal may be located generally on the perpendicular bisector of the connector.

In one embodiment of the current invention, an apparatus includes a printed wiring board having a plurality of wiring layers for implementing electrical interconnections including conductive planes. A connector is attached to the printed wiring board for receiving a removable module and for providing electrical interconnections between the removable module and the printed wiring board. The connector has a first plurality of power pins connected to a conductive plane of the printed wiring board for communicating a particular voltage conveyed on the conductive plane to the removable module. At least one power terminal is connected to the conductive plane of the printed wiring board at respective locations generally symmetric to a line perpendicular to the connector and bisecting the first plurality of power pins, for operably receiving the particular voltage.

A method embodiment of the present invention is suitable for use in a printed wiring board having at least one wiring layer for implementing electrical interconnections including conductive planes, and having a connector attached to the printed wiring board for receiving a removable module and for providing electrical interconnections between the removable module and the printed wiring board, the connector having a first plurality of power pins connected to a conductive plane of the printed wiring board for communicating a particular voltage conveyed on the conductive plane to the removable module, the printed wiring board further having at least one power terminal connected to the conductive plane of the printed wiring board for operably receiving the particular voltage. A method for reducing the difference in current flow between power pins of the connector having the highest current flow and power pins of the connector having the lowest current flow includes locating the at least one power terminal at respective locations on the printed wiring board generally symmetric to a line perpendicular to the connector and bisecting the first plurality of power pins.

The present invention may be better understood, and its numerous features and advantages made even more apparent to those skilled in the art by referencing the detailed description and accompanying drawings of the embodiments described below. These and other embodiments of the present invention are defined by the claims appended hereto.

BRIEF DESCRIPTION OF THE DRAWINGS

FIG. 4 is a print-out of a portion of a mathematical spreadsheet model for the wiring layer shown in FIG. 3, for modeling the shape and resistance of the power planes formed in the wiring layer.

FIG. 5 is a print-out of a portion of a mathematical spreadsheet model for the wiring layer shown in FIG. 3 and also for a removable module, which depicts the intermediate voltages for each modeled element within the power planes of both the module and the motherboard, for a normalized 10 volt potential applied between the CPU footprint on the module and the power terminals of the power plane in the motherboard.

FIG. 9 is a print-out of a portion of a mathematical spreadsheet model for modeling the shape and resistance of the power plane shown in FIG. 8.

FIG. 16 is a print-out of a portion of a mathematical spreadsheet model for a power plane having no cutouts and having a pair of symmetrically located power terminals, and also for a removable module, which depicts the intermediate voltages for each modeled element within the power planes of both the module and the motherboard, for a normalized 10 volt potential applied between the CPU footprint on the module and the power terminals of the power plane in the motherboard.

FIGS. 20–26 are planar drawings illustrating various arrangements of power planes, motherboard connectors having groups of power pins located symmetrically or asymmetrically within the connector, and one or more power terminals making connection to a power plane of the motherboard, which each incorporate one or more aspects of the present invention.

The use of the same reference symbols in different drawings indicates similar or identical items.

DESCRIPTION OF THE PREFERRED EMBODIMENT

Figure 1:
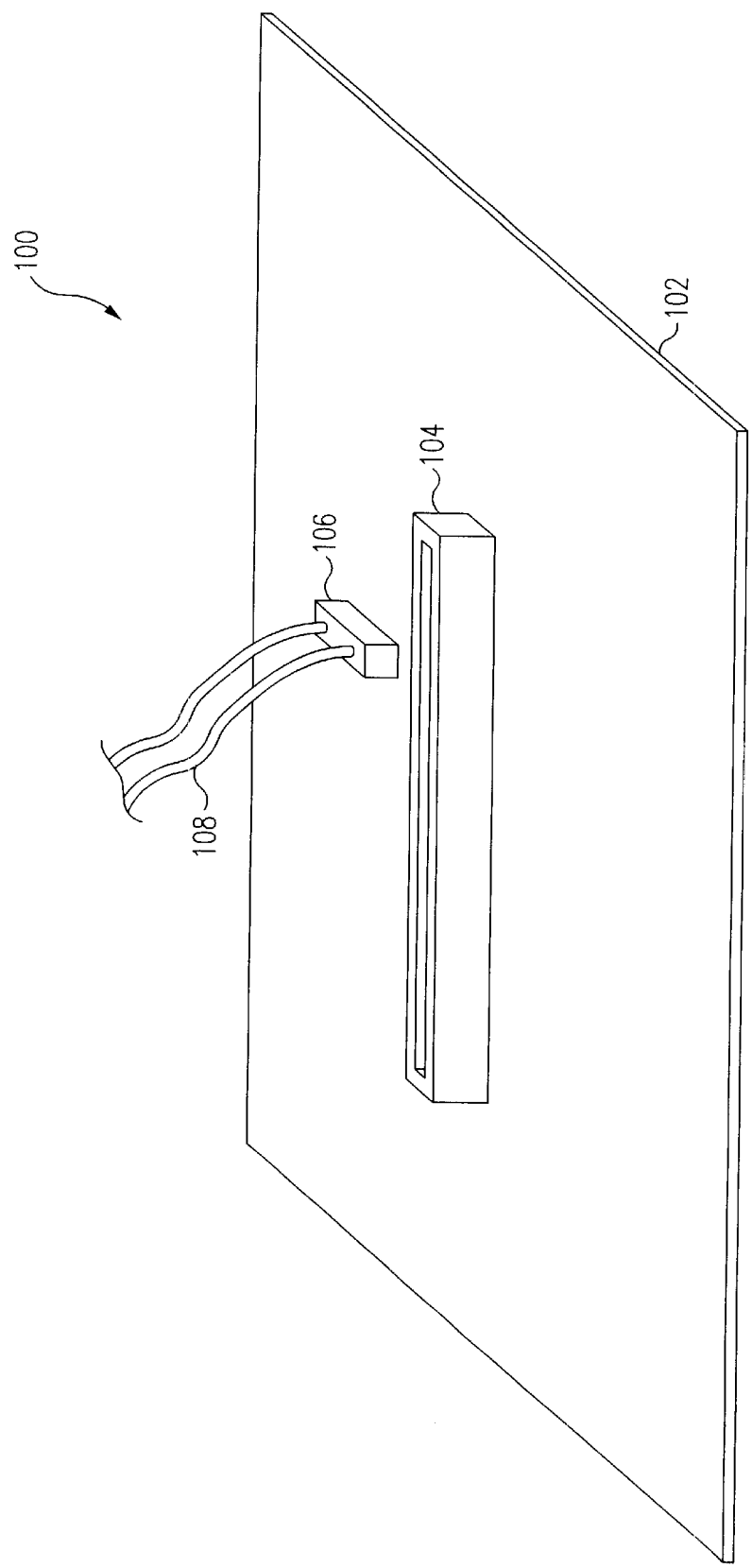
FIG. 1, labeled prior art, is an isometric drawing illustrating a motherboard having a connector for a removable module.

Referring to FIG. 1, a motherboard 100 is shown which includes a printed wiring board 102 having typically several wiring layers (not shown). A connector 104 is attached to the motherboard and provides a receptacle to receive a removable module which is inserted into the connector 104 to attach and connect the circuitry contained on the removable module to circuits contained elsewhere on the printed wiring board 102. A connector 106 is also removably attached to the motherboard 100 to provide a power supply voltage conveyed on wire 108 to the motherboard 100. Such a wire 108 frequently is an output of a power supply contained within an electronic system, which power supply includes several output wires conveying various voltages and may include one or more than one connectors such as connector 106 to plug into various subsystems and printed wiring boards within an electronic system, as is well known in the art.

Figure 2:
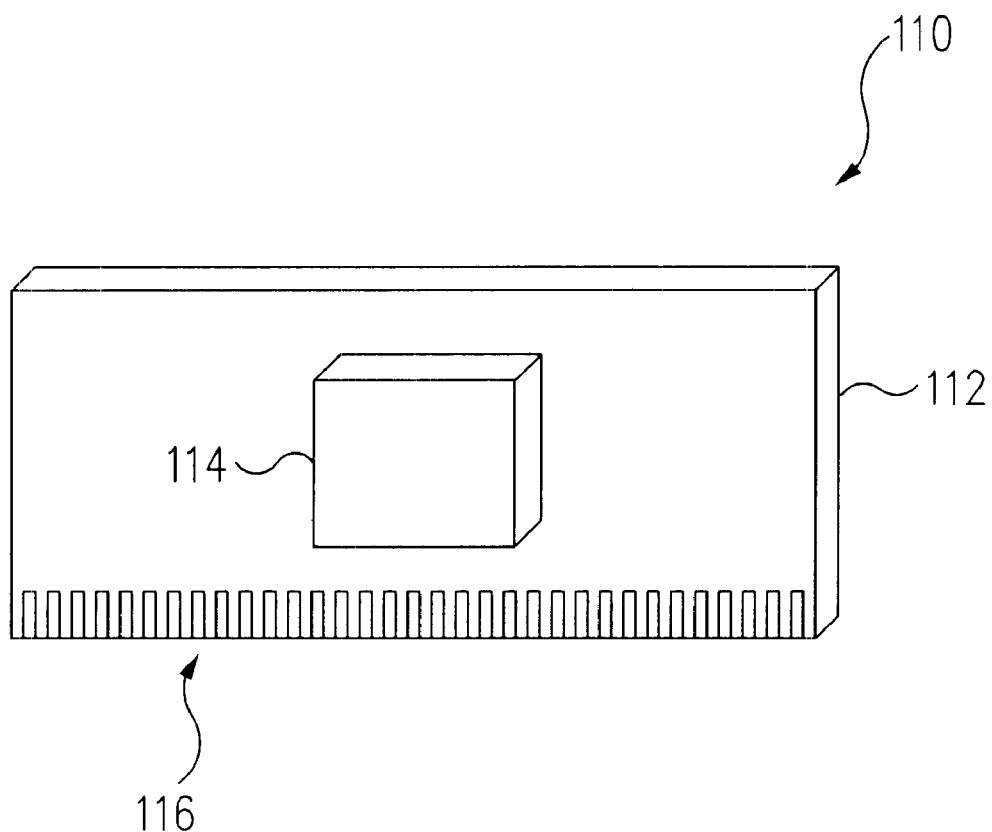
FIG. 2, labeled prior art, is an isometric drawing illustrating a removable module, such as a CPU module, for a motherboard as shown in FIG. 1.

Referring now to FIG. 2, a removable CPU module 110 is depicted of a type which may be inserted into the connector 104 of the motherboard 100 shown in FIG. 1. The module 110 includes a small printed wiring board 112 having along a bottom edge a plurality of connector fingers 116 which, when inserted into the connector 104, mate with and electrically interconnect with connector pins of the connector 104. A packaged CPU 114 is shown attached to the printed wiring board 112. A variety of electrical interconnections (not shown) are included within the printed wiring board 112 to connect various terminals of the packaged CPU 114 to various terminal fingers 116. Such electrical interconnections may be on the two outer surfaces of printed wiring board 112 or may also be routed along interior wiring layers of printed wiring board 112.

Connectors may be of any of several different basic types including card edge connectors such as for an ISA bus or PCI bus card, and card edge connectors adapted for multiple rows of terminal fingers on each side of a printed wiring board, such as the Slot One™ Connector (trademark of the Intel Corporation, Santa Clara, Calif.). Other connectors include those having one or more rows of regularly spaced pins such as, for example, VME bus connectors, and any of a wide variety of other removable connectors which allow typically a smaller printed wiring board to plug into and connect with circuitry contained on a larger or main circuit board.

Figure 3:
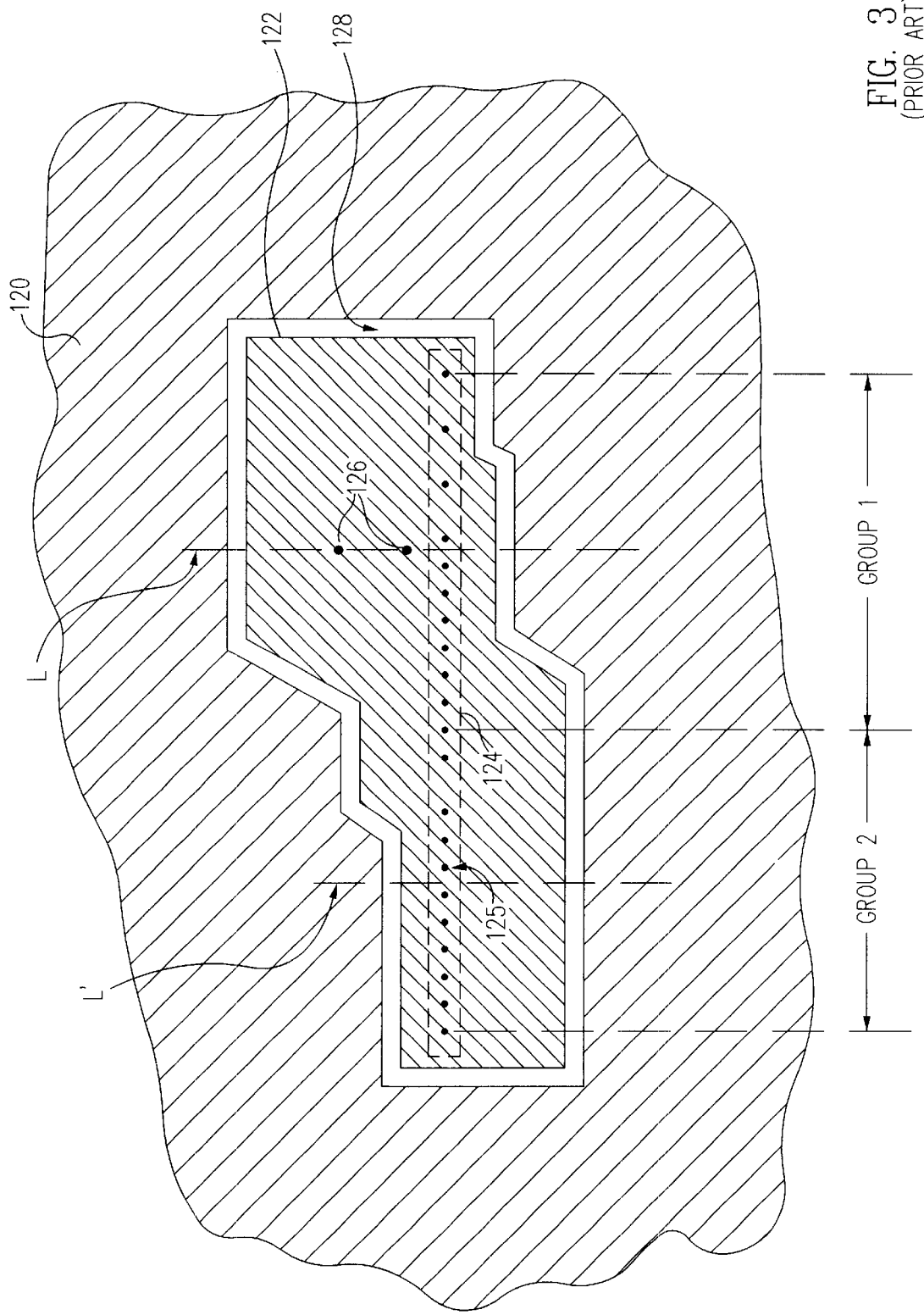
FIG. 3, labeled prior art, is a planar drawing illustrating an arrangement of two power planes formed in a single wiring layer within a motherboard, and in particular shows a power plane which is arranged to convey a voltage received on a pair of power terminals to the power pins of a connector.

Referring now to FIG. 3, a particular wiring layer of the printed wiring board 102 is shown which includes a first power plane 120 extending throughout the majority of the printed wiring board with the exception of a region near the connector 104. A cutout 128 separates the first power plane 120 from a second power plane 122 also implemented on the same wiring layer. The cutout 128 is also frequently known as a moat which is cut in the conductive material forming the wiring layer to afford electrical isolation between, in this case, power plane 120 and power plane 122. Two power terminals 126 are shown attached to power plane 122 and which provide connections from a regulated source of voltage to the power plane 122. While two power terminals 126 are shown in this example, the number of such regulator connections may vary depending upon the number of phases that are implemented in the regulator for the motherboard. Typical motherboard regulators can-vary from a single phase to four phases for particularly high current applications.

The general location of the connector 104 is shown as a dashed outline labeled 124. A variety of power pins 125 are shown which are each connected to the power plane 122. Each of these power pins 125 provides a connection for communicating the voltage conveyed on power plane 122 to a removable module which is inserted into connector 104. Each of these power pins 125 can support a flow of current and, in aggregate, provides the total current flow to the removable module.

An analysis method was devised to calculate the current through each of such power pins as a function of: (1) the location of the power pin within the connector; (2) the location of the power terminal on the motherboard which provides the power to the power plane; (3) the resistivity of the power planes in both the motherboard and in the removable module; and (4) the extent and shape of each such power plane, especially the power plane on the motherboard. A mathematical spreadsheet model was devised to solve for the current distribution within the power planes and through each of the power pins of the connector. In the model, the power planes are divided into discrete elements, such as a 5×5 mm square region. The current within a power plane into each element of the power plane is calculated as the respective voltage differential between a given element and the respective four adjacent elements divided by the respective resistance between the given element and the respective four adjacent elements, in accordance with Equation 1.

$$I_{ELEMENT} = V_l/R_l + V_r/R_r + V_u/R_u + V_d/R_d \qquad (1)$$

In Equation 1, the subscripts l, r, u, d correspond respectively to left, right, up, and down. Each element along the connector edge of the removable module is mathematically coupled to the corresponding element of the motherboard power plane beneath the connector by a resistance that models the connector pin, and the current therethrough computed similarly. The voltage of the microprocessor package footprint is arbitrarily set to a convenient voltage, typically 10 volts, and the power terminal connection to the power plane on the motherboard is set to 0. The potential of each element is then calculated by iteration until a stable solution is reached. As this particular method is not a particularly sophisticated solution technique, quite a few iterations are required of the spreadsheet model before a stable solution is reached. The calculation time may easily require 50–100 seconds using a 300 MHz personal computer. But when a stable solution is reached, the current per power pin as a function of the position of the power pin within the connector may be computed. For example, by arbitrarily setting the voltage of the microprocessor package footprint to 10 volts and the voltage of the power terminal connection to the power plane on the motherboard to 0 volts, a total amount of current flowing between the two regions will be determined by the model calculations. If this current is then normalized to a target value of, for example, 30 amps, the voltage and currents may be scaled to determine the magnitude of the current flowing through each of the power pins of the connector.

Figure 4:
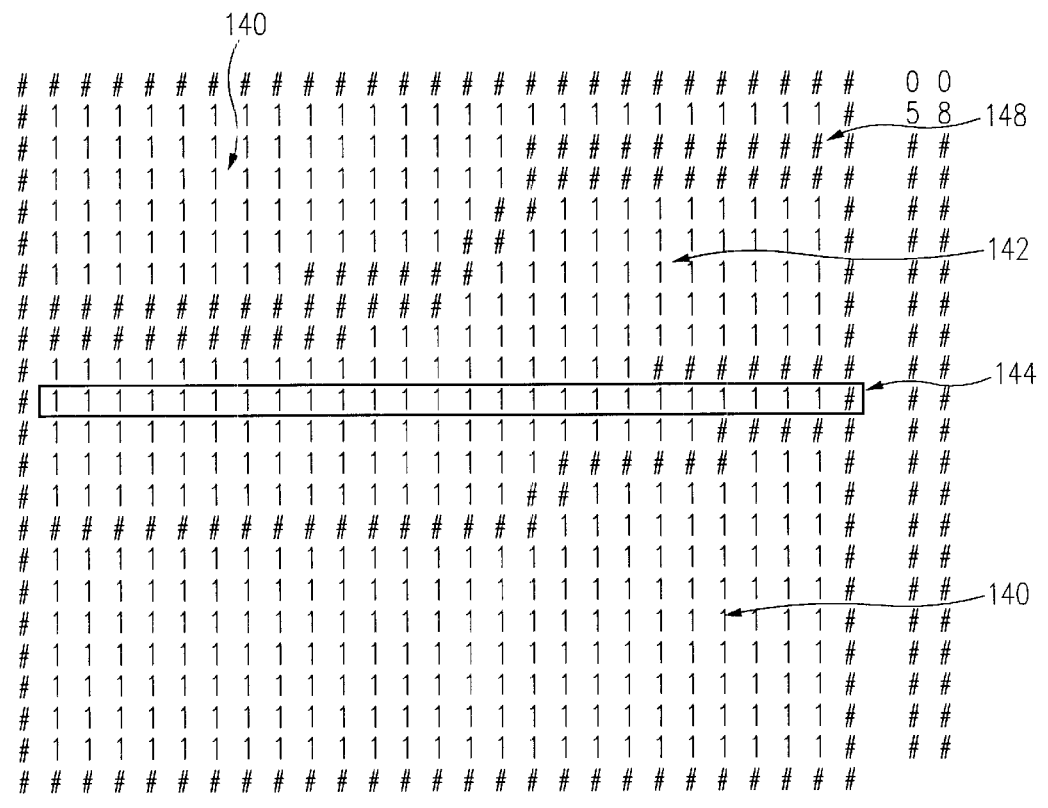

FIG. 4 shows a spreadsheet model representation of the resistance per element of the wiring layer represented in FIG. 3 and shows the general shape of power plane 122, the moat 128 surrounding power plane 122, and portions of power plane 120. The portion corresponding to power plane 122 is labeled 142 in FIG. 4. The number at each location within FIG. 4 corresponds to the resistance per square of the wiring layer at that location. For example, the resistance per square of the area 142 which corresponds to the power plane 122 is indicated in the figure as a "1" which is a rounded off representation of 0.588 ohms per square of the copper layer (for this example) forming the power plane 122. The "pound signs" 148 correspond to, as is common with many spreadsheets, a number that is larger than fits within the formatted size of each cell. In this case, the pound signs 148 represent an absence of metal corresponding to the moat 128 between the power plane 122 and the power plane 120, and which moat is numerically represented by an ohms per square value of 1E+07 or 10 meg ohms per square. In this way, a uniform mathematical treatment may be applied in terms of summing the current into each node, with the separation between power planes modeled by a small region having an extremely high impedance. As can be seen in FIG. 4, the shape of region 142 corresponds generally to the shape of power plane 122 shown in FIG. 3. Region 144 corresponds to the location of the connector 124, and region 140 both in the upper portion of FIG. 4 and in the lower portion of FIG. 4 corresponds to neighboring portions of power plane 120 which, as can be expected, do not contribute to current flow through the power pins of the connector.

Referring now to FIG. 5, the voltage of each element is depicted after iteration to a stable solution of the algorithm described thus far. In FIG. 5, the digits represents the voltage of each element, assuming 10 volts between the microprocessor package footprint 150, and the power terminals (labeled as 126 in FIG. 3) connected to the power plane. While only one digit is shown which gives an approximate value visually of the voltage of a given element, the model preferably calculates the voltage to a much higher degree of precision than is depicted in FIG. 5. The lower portion of FIG. 5 maps directly onto FIG. 4 with a one-to-one correlation between the voltage of a given element (as shown in FIG. 5) compared to the resistance of the given element (as shown in FIG. 4). The upper portion of FIG. 5 illustrates the voltage of corresponding elements of the removable module assuming it is connected to the motherboard by way of connector 104. While the upper half of FIG. 5, as clearly shown, is a two-dimensional representation similar to the lower portion of FIG. 5, the figure can be best appreciated by mentally connecting the bottom row 145 of the upper portion to the connector region 144 traversing across the center portion of the motherboard shown in the lower portion. As viewed in FIG. 5, the module would physically project toward the reader from the printed page, but for ease of representation, the module is depicted in the same plane and horizontally displaced from its inserted location in the connector itself. Nonetheless, taken as a whole, the upper portion of FIG. 5 represents the respective voltage of each element within the removable module when connected to the connector region 144 traversing across the motherboard portion in the lower half of the figure, which lower half depicts the respective voltage of each element within the power plane of the motherboard. The resistance of each connector pin is modeled by way of a resistance between each element of the bottom row of the module with the corresponding element in the center of the motherboard in the connector region 144. It should be noted that since the simulation methodology discretizes the power plane into a 5 mm×5 mm grid, there may be multiple connections within a single grid cell (i.e., element) from the power plane to either a connector pin or to a power terminal.

Figure 6:
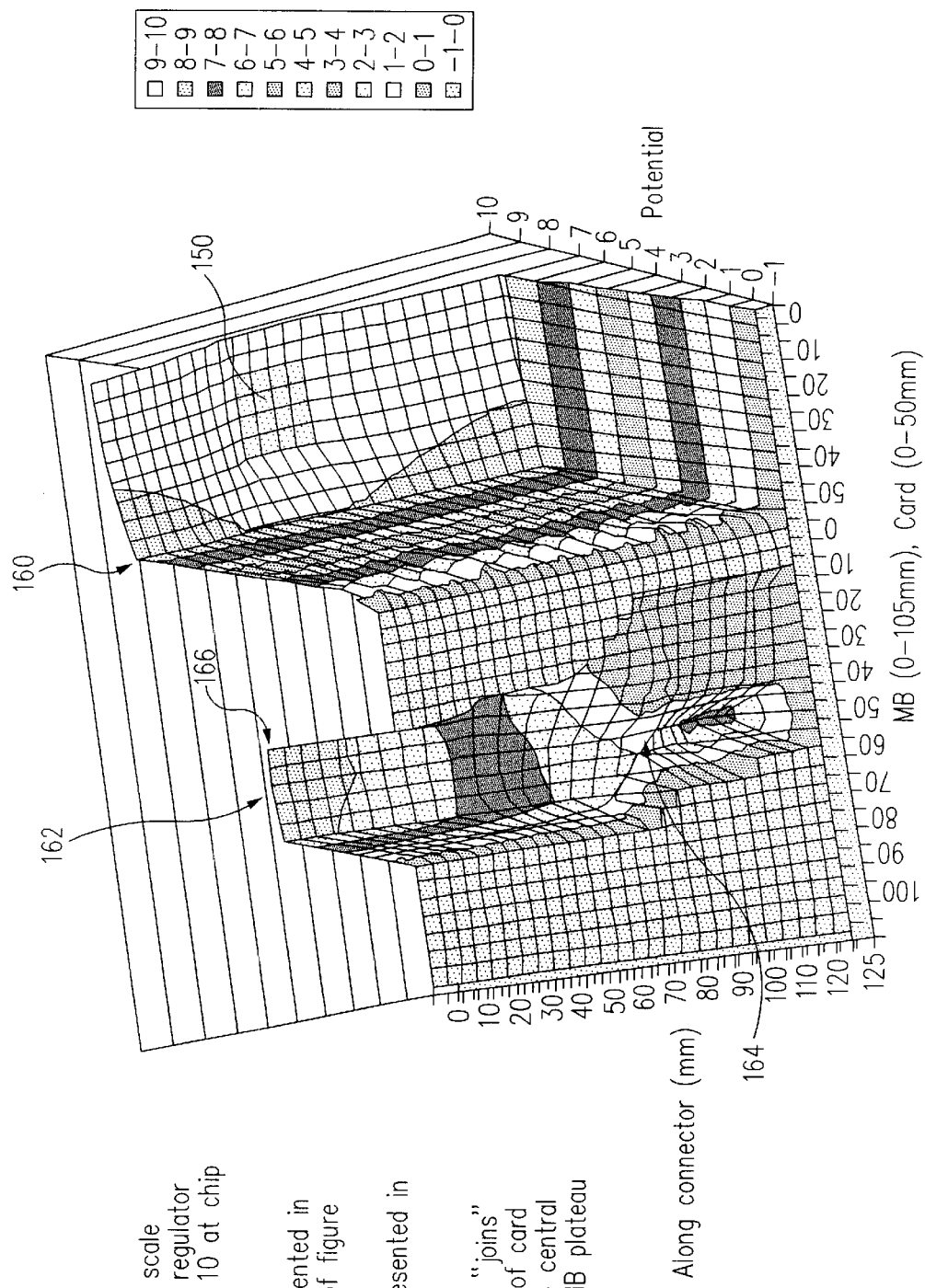
FIG. 6 is a three-dimensional chart illustrating the voltage of each element as calculated according to the model shown in FIG. 5.

In FIG. 5, by showing only one rounded off digit of the voltage of each of the elements, a rough impression may be discerned by observation of this figure. However, a three-dimensional representation is far easier to appreciate the contours of current flow calculated thus far. Such a three-dimensional figure is graphed in FIG. 6. The magnitude of the voltage of each element within FIG. 5 is shown in FIG. 6 on the vertical scale. The height of the figure in a particular region corresponds to the voltage of the element within that region. The motherboard is represented in the left two-thirds of the figure, while the printed wiring board of the removable module is represented in the right one-third. The left two-thirds and the right one-third of this figure in one sense are separate representations of the voltage, but as described in regard to FIG. 5 the connector edge of the removable module electrically is connected through power pins of the connector to a corresponding element of the power plane within the motherboard. Specifically, FIG. 6 may be then appreciated by understanding that the connector joins the left edge of the plateau corresponding to the removable module (labeled as 160) to the central ridge of the plateau corresponding to the motherboard (labeled as 162). The difference in height between two corresponding elements along these two plateaus corresponds to the voltage drop across the respective power pin of the connector connecting the two corresponding elements.

As can be appreciated from FIG. 6, the portion of the motherboard power plane most distant from the power terminal (labeled as 166) reaches a higher equilibrium voltage (here shown as approximately 4.8 volts) than does the portion of the motherboard power plane nearest the power terminal, labeled as region 164. The current through a power pin at a given location may be calculated by observing the differential between the voltage at the connector side of the removable module compared to the voltage of the corresponding element of the motherboard's power plane to which the corresponding power pin of the connector is connected. Such a current calculation may then be normalized by adjusting the total calculated current flow by the appropriate ratio between the computed current (based upon a 10 volt differential) and the actual current of interest for the module.

Figure 7:
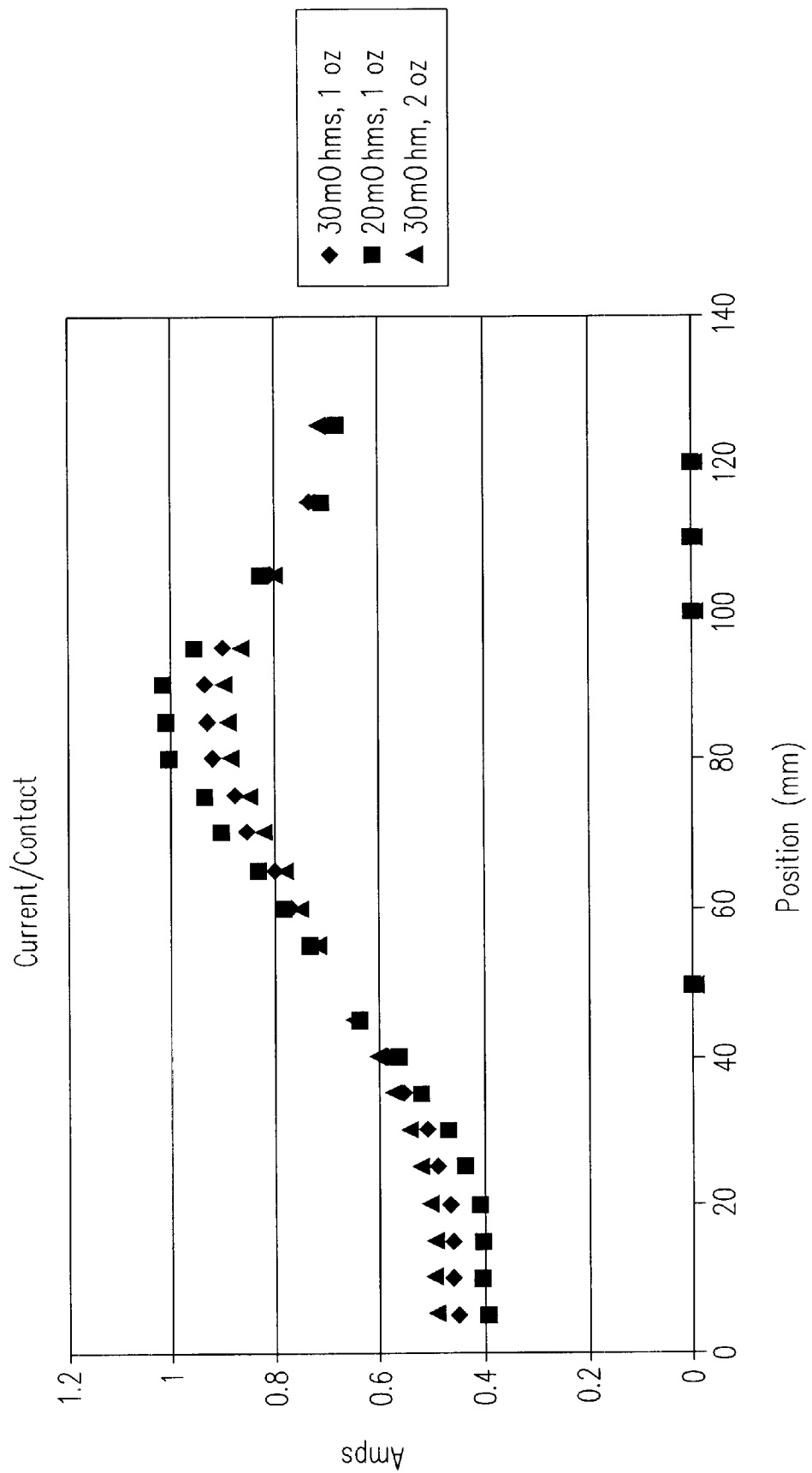
FIG. 7 is a two-dimensional chart illustrating the magnitude of current flow through each of the power pins of the motherboard connector shown in FIG. 3, for three different sets of assumptions for the resistance of the power planes and the resistance of the connector pins.

FIG. 7 represents the current per connector pin (i.e., also called a "contact") normalized for a 30 amp total current flow to the removable module. The results of three separate calculations are shown in FIG. 7, each varying the combination of thickness of the power plane within the motherboard and the resistance of each of the connector pins. In particular, the data points represented as diamonds correspond to a one-ounce copper power plane and 30 milliohm (i.e., 30 mΩ) contacts; the data points plotted as squares correspond to one ounce copper power planes and 20 milliohm contact resistance; and the data points plotted as triangles correspond to 2 ounce copper power planes and 30 milliohm contact resistance. In correspondence with the relative heights of the plateaus depicted in FIG. 6, the current per connector pin is at its highest in a region of the connector most closely located near the power terminal connected to the power plane. In this case, the magnitude of the current per connector pin reaches one amp per connector pin for the one-ounce copper 20-milliohm combination. In contrast, the current flow through the most distant connector pin at the far left end of FIG. 7, which corresponds to a power pin in the upper region of the motherboard section of FIG. 6 (labeled 166), is approximately 0.4 amps. Looking at the data points depicted as squares, the ratio between the maximum current per pin and the minimum current per pin is a full 2.5:1 ratio, with the maximum current nudging just past one amp per connector power pin.

Figure 8:
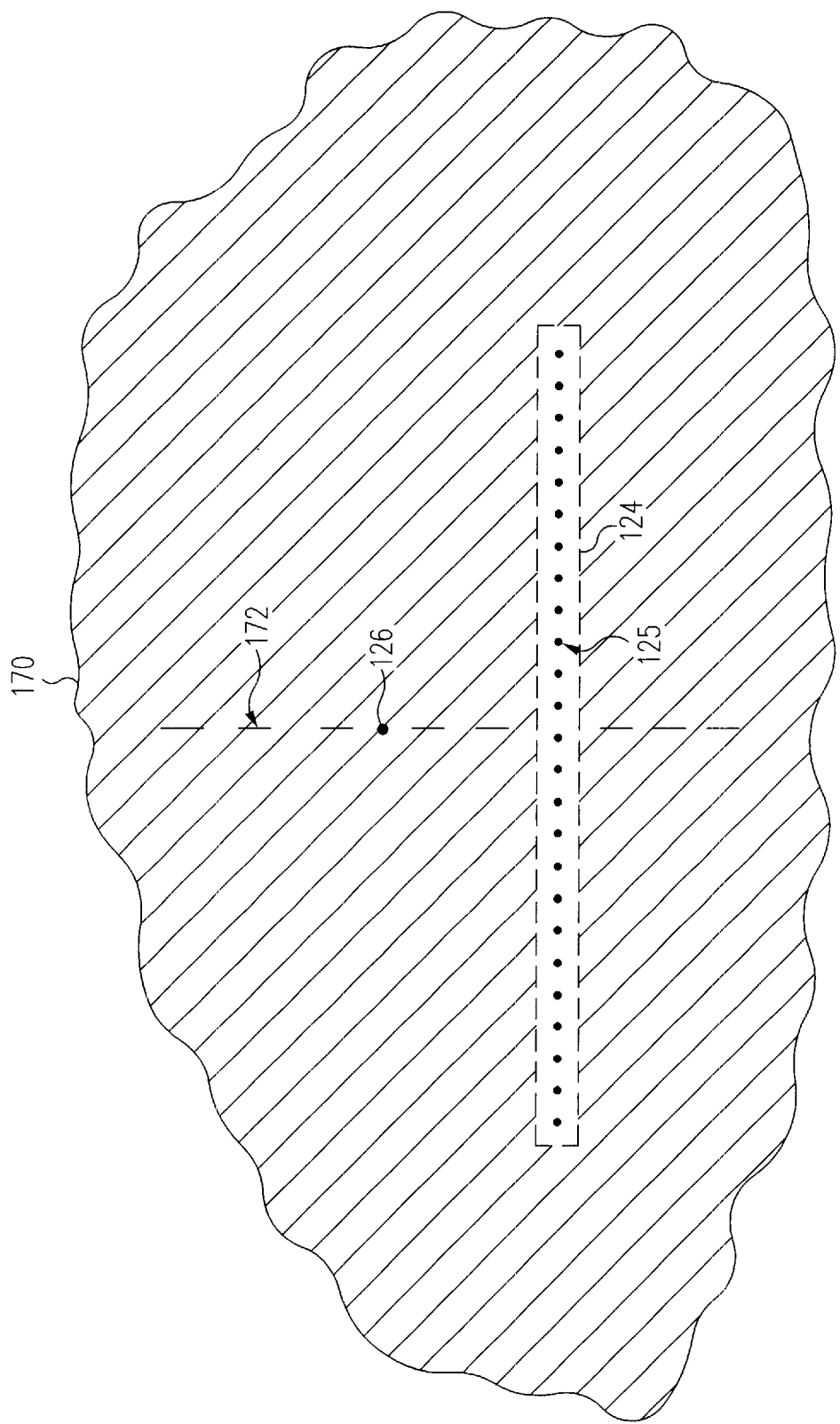
FIG. 8 is a planar drawing illustrating an arrangement of a single power plane formed in a wiring layer within a motherboard which is arranged to convey a power supply voltage received on a pair of power terminals to the power pins of a connector.

The next several figures depict the results of the same calculation for a power plane having a different configuration. It should be appreciated that, as previously stated, such a power plane may serve to convey an "actual" power supply voltage, such as VDD, or may serve equally well to convey a ground reference voltage VSS, or even some other voltage. Referring now to FIG. 8, a power plane 170 is shown in which the power terminals 126 connecting to the power plane are located along a line 172 perpendicularly bisecting the connector 124 and moreover at a distance from the connector greater than was depicted in FIG. 3. Additionally, no moats are shown in the power plane 170 which, in the region near and surrounding the connector 124, includes the entire wiring layer as part of the power plane.

Figure 9:
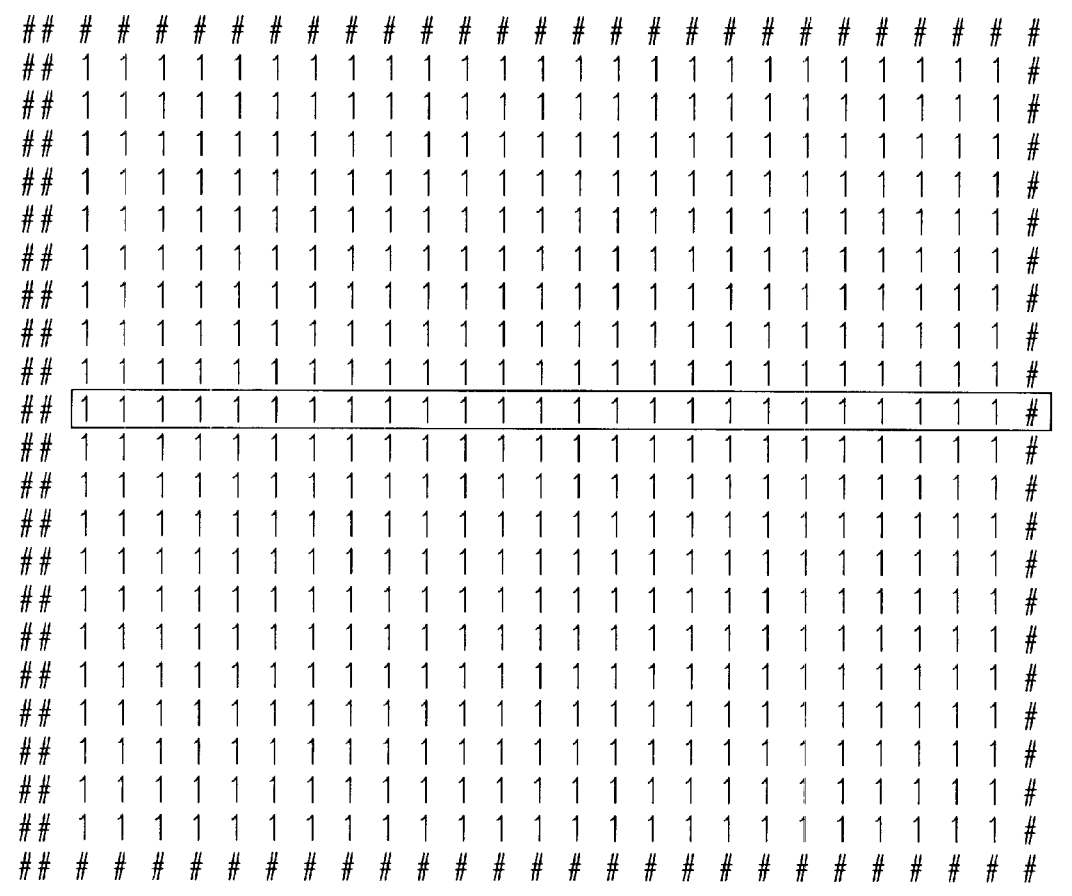

Referring now to FIG. 9, the resistance per square of the power plane 170 in the motherboard for this example is depicted analogously to that shown earlier in FIG. 4. However, in this case, there are no cutouts or moats in the power plane. Consequently, the resistance per square is uniform throughout the modeled region.

Figure 10:
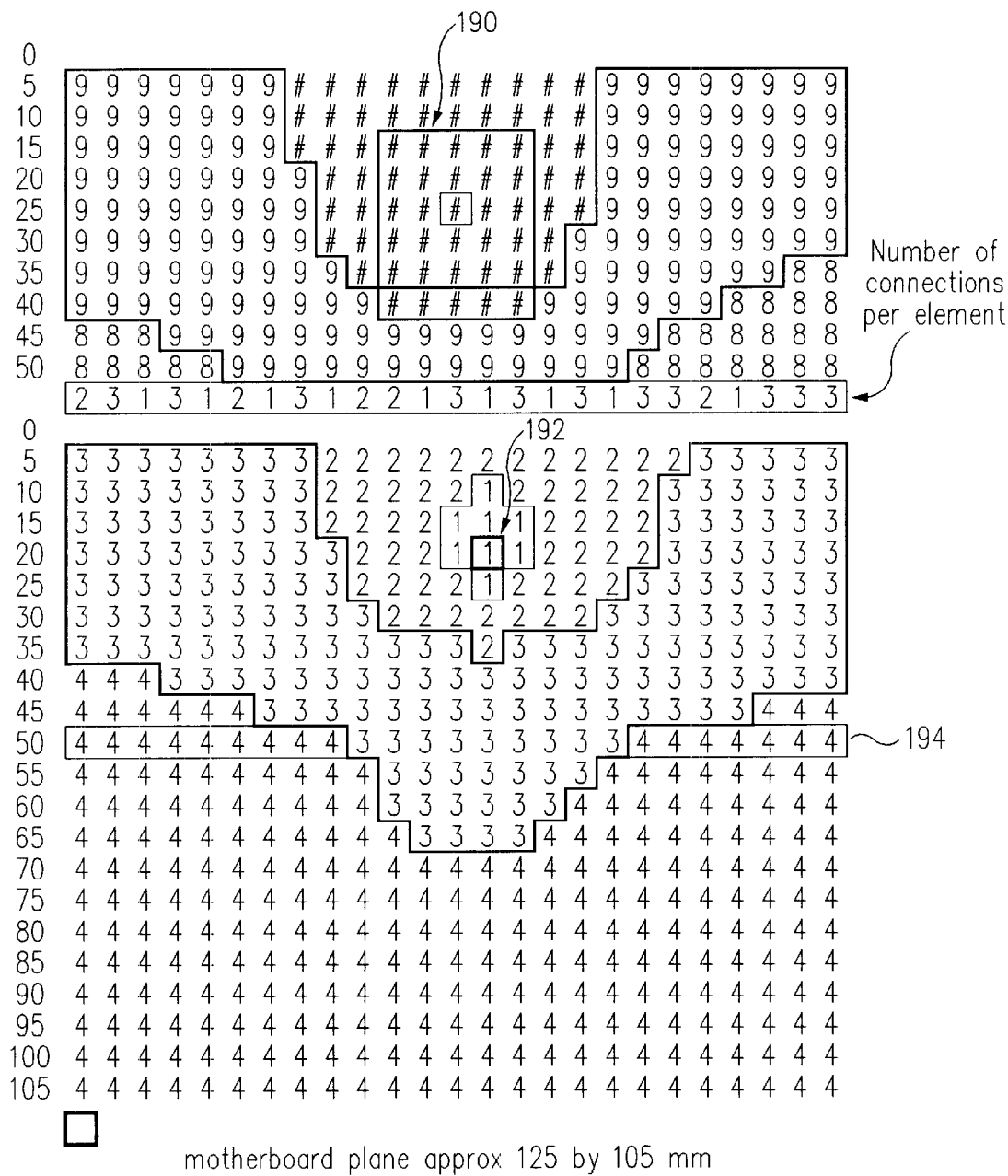
FIG. 10 is a print-out of a portion of a mathematical spreadsheet model for the wiring layer shown in FIG. 8 and also for a removable module, which depicts the intermediate voltages for each modeled element within the power planes of both the module and the motherboard, for a normalized 10 volt potential applied between the CPU footprint on the module and the power terminals of the power plane in the motherboard.

FIG. 10 depicts the results of the iteration to compute the voltage of each element, using the method as described above. As before, the upper portion of FIG. 10 represents the respective voltage of each element within the removable module when connected to the connector region 194 traversing across the motherboard portion in the lower half of the figure, which lower half depicts the respective voltage of each element within the power plane of the motherboard. The voltage of the microprocessor package footprint, here labeled as 190, is arbitrarily set to 10 volts, and the voltage of the power terminal connecting to the power plane, here labeled as 192, is arbitrarily set to 0 volts. In FIG. 10, the voltage of each element is shown rounded to one digit and shows a much more uniform distribution of voltage than previously described.

Figure 11:
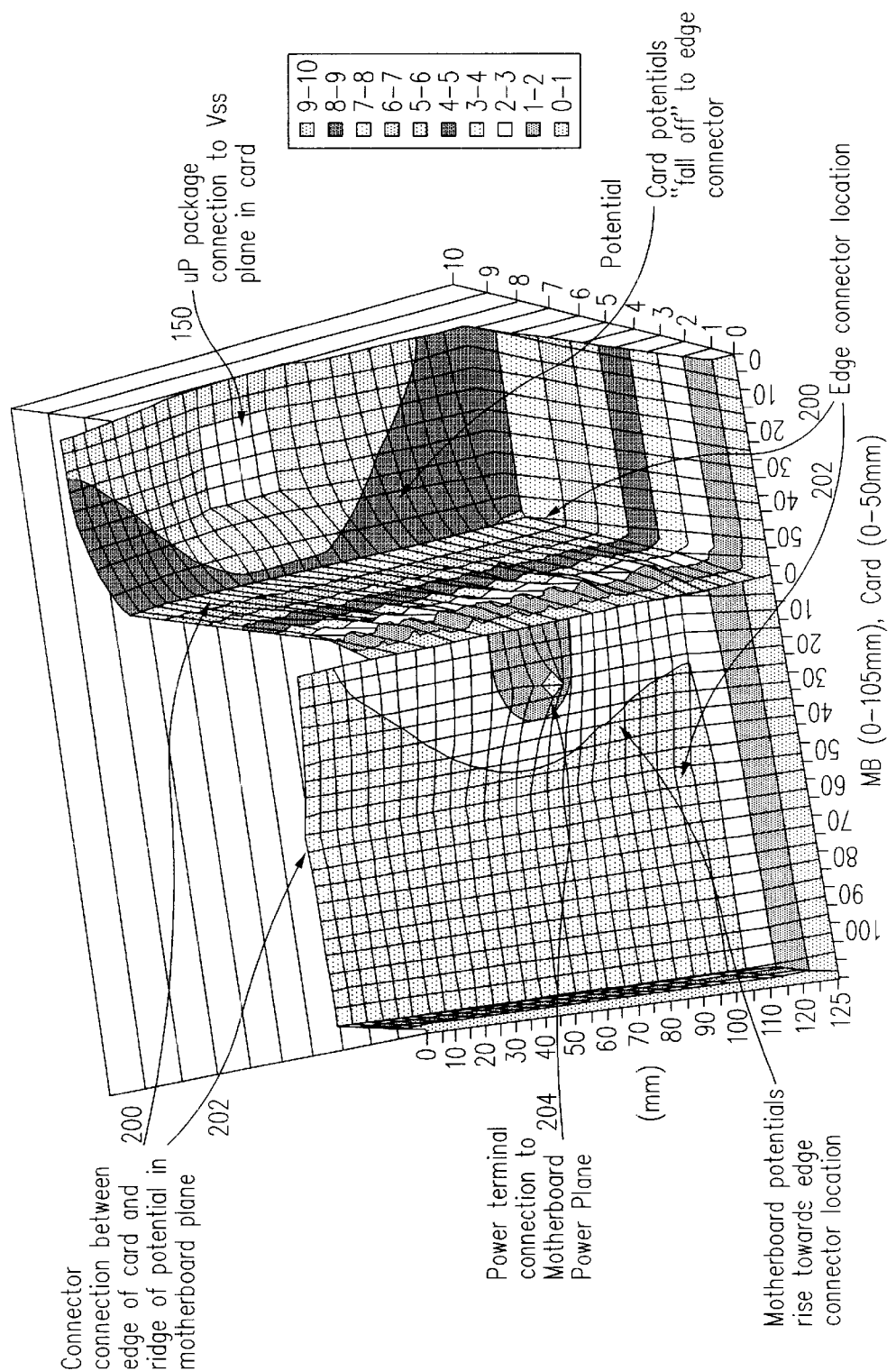
FIG. 11 is a three-dimensional chart illustrating the voltage of each element as calculated according to the model shown in FIG. 10.

Referring now to FIG. 11, a three dimensional representation of the voltage is depicted as a result of the calculation shown in FIG. 10 for the case of a one ounce copper power plane and 30 milliohm contact resistance. As before, the motherboard connector electrically connects the voltage at the left edge 200 of the removable module to the ridge 202 of the potential in the motherboard plane. The lowest voltage, of course, is the power terminal connection to the power plane of the motherboard labeled as region 204.

Figure 12:
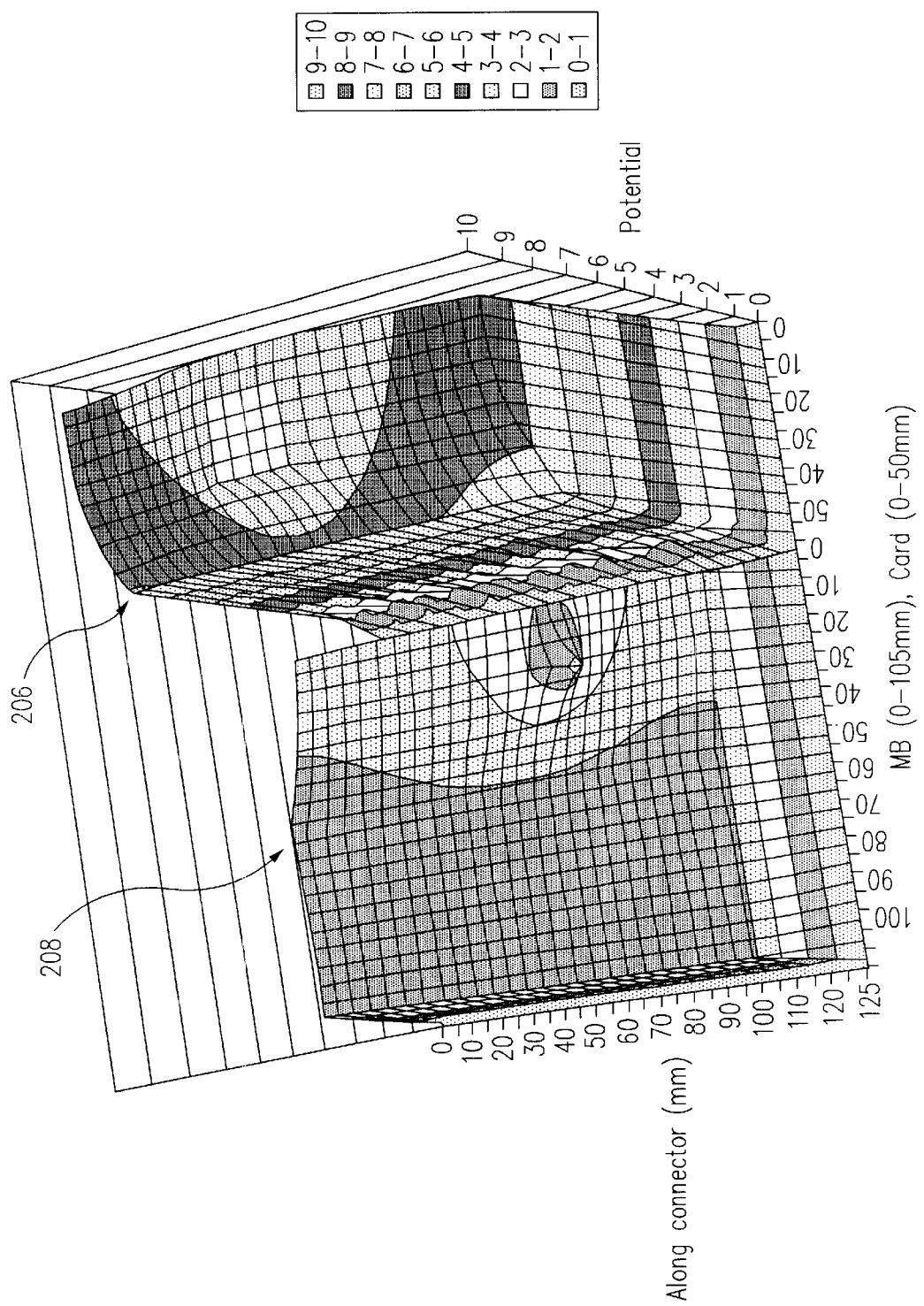
FIG. 12 is a three-dimensional chart illustrating the voltage of each element as calculated according to the model shown in FIG. 10, for another set of resistance assumptions for the power planes and the connector pins.
Figure 13:
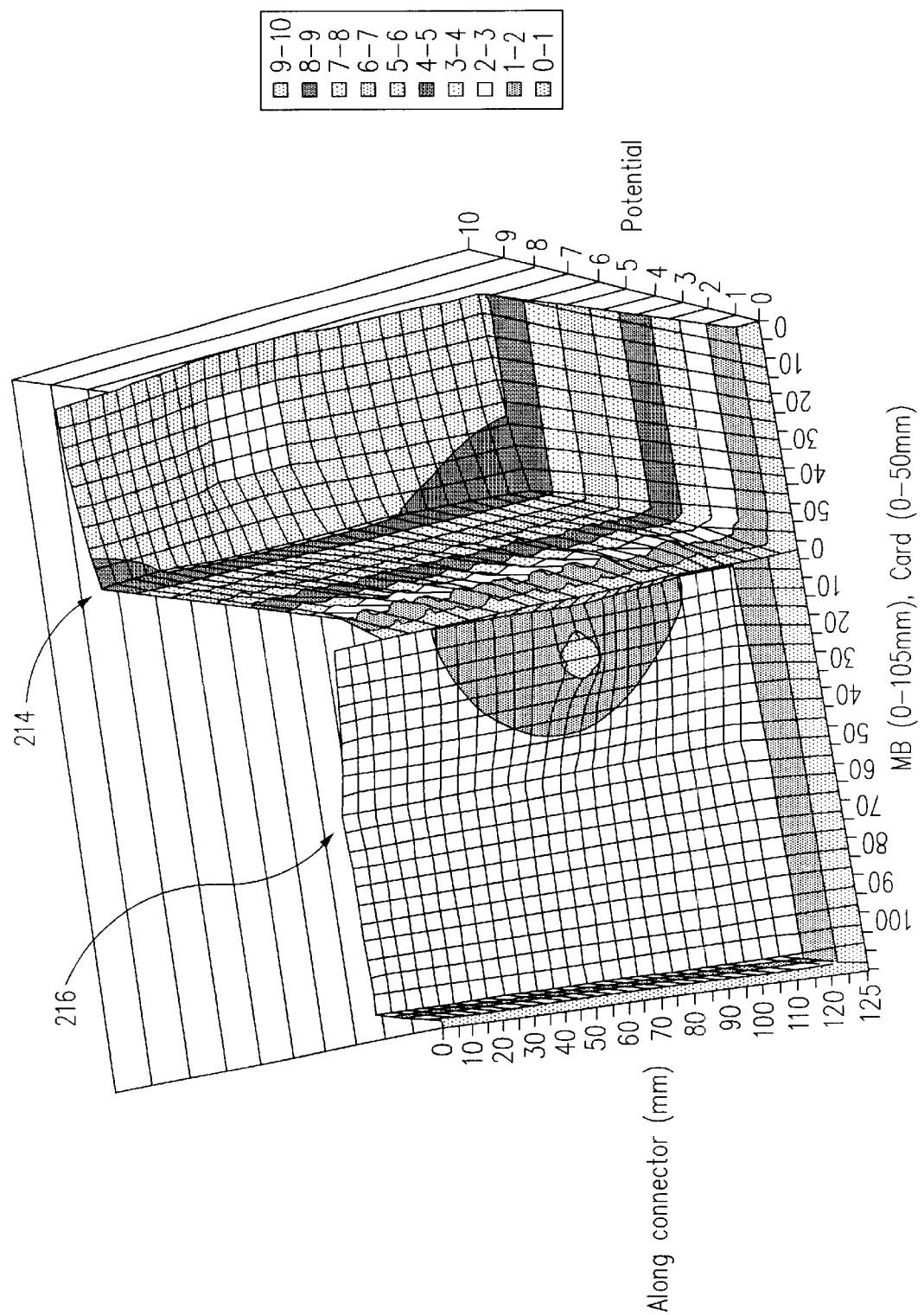
FIG. 13 is a three-dimensional chart illustrating the voltage of each element as calculated according to the model shown in FIG. 10, for yet another set of resistance assumptions for the power planes and the connector pins.

FIG. 12 depicts the voltages computed for the case of one-ounce copper power planes and a 20-milliohm resistance per connector. As can be seen in the figure, there is significantly less variation in voltage drop across the connector when compared to that depicted in FIG. 6, which results in a smaller variation in current through each power pin of the connector. The voltage as calculated for the case of two-ounce copper power planes and 30-milliohm resistance per connector is shown in FIG. 13. Here, one can see an even smaller voltage drop across the power planes due to the increased thickness of the copper power planes, and the resulting lower resistance per square of the power planes. This results in a greater voltage drop across the connector (for the simulation with a fixed 10 volts impressed between the package footprint and the motherboard power terminal), but a more uniform voltage drop across the various power pins of the connector, and consequently a smaller variation in current flow through each power pin of the connector.

Figure 14:
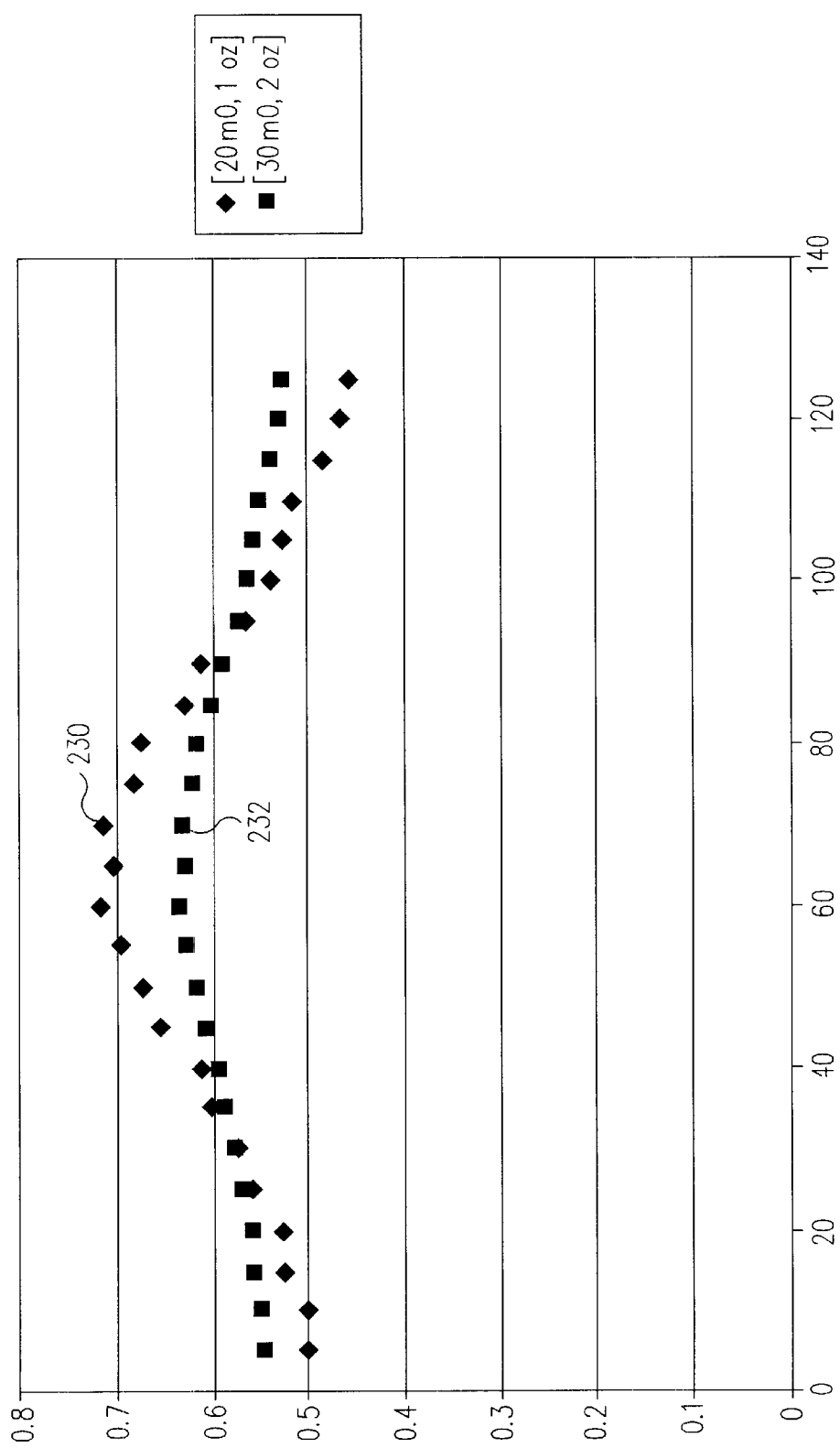
FIG. 14 is a two-dimensional chart illustrating the magnitude of current flow through each of the power pins of the motherboard connector, for two different sets of assumptions for the resistance of the power planes and the resistance of the connector pins, corresponding to the power plane depicted in FIG. 8.

The computations shown in FIGS. 12 and 13 may be normalized for a 30 amp total current flow to the removable module and the resulting current per pin of the connector may be computed. These results are illustrated in FIG. 14, which shows for the two cases described above the magnitude of the current per power pin as a function of the spatial location along the length of the connector of the particular power pin. The data points represented by diamonds corresponds to the case in FIG. 12 of one-ounce copper power planes and 20-milliohm resistance per connector pin. As can be clearly appreciated, the highest amount of current flow through any power pin of the connector is approximately 0.7 amps in the region located nearest the power terminal to the power plane, and falls off to a minimum amount of current of approximately 0.5 amps at either end of the connector. The data points represented as squares corresponds to the computation in FIG. 13 which corresponds to two-ounce copper power planes and 30 milliohms of resistance per connector pin. Here, the current per power pin is even more uniform, and ranges from a high of approximately 0.63 amps in the region located nearest the power terminal to the power plane, to a low of approximately 0.53 amps at either end of the connector.

For each of these two cases, the worst case magnitude is lower than the earlier analyzed case, and the differential between the highest and lowest current flow through any given power pin is also reduced. In other words, each power pin of the connector is conducting a current that is nearer in magnitude to the current through any other power pin of the connector than in the earlier case. This result is accomplished by locating the power terminal along the perpendicular bisector of the connector and at a greater distance from the connector than in the earlier case. This allows the current flow to spread out more before reaching the nearest power pin, which results in a greater amount of sharing of current between the power pins, rather than a situation where a small number of the power pins have a far lower resistance than others, and consequently conduct an inordinately high share of the total current flow. Also as can be seen in FIG. 14, the worse case current is reduced, and the variation in current between power pins is more uniform, in the case when a thicker power plane having a lower resistance is incorporated within the motherboard.

Figure 15:
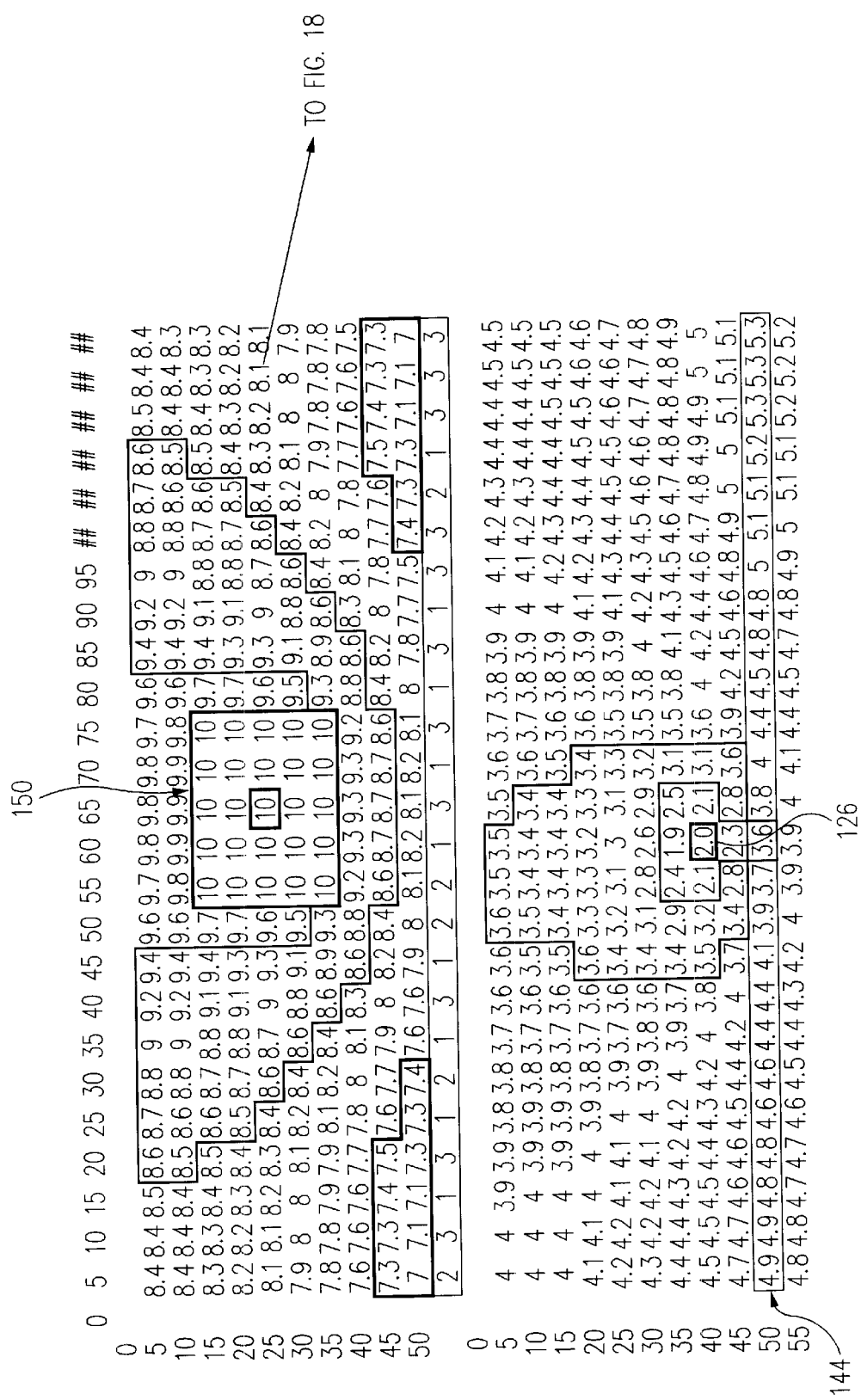
FIG. 15 is a print-out of a portion of a mathematical spreadsheet model for a power plane having no cutouts and having a single power terminal, and also for a removable module, which depicts the intermediate voltages for each modeled element within the power planes of both the module and the motherboard, for a normalized 10 volt potential applied between the CPU footprint on the module and the power terminals of the power plane in the motherboard.

The beneficial effect of locating the power terminals further away from the connector for improving connector power pin current uniformity is shown more dramatically by the examples depicted in FIG. 15 through FIG. 19, which describe six different configurations of one or more power terminals, each computed under 8 different values of the linear spacing between the power terminal(s) and the motherboard connector. Referring now to FIG. 15, a portion of a mathematical spreadsheet model is shown for a motherboard power plane having no cutouts and having a single power terminal 126 located 10 mm from the connector 124 and located a distance of 5 mm from the perpendicular bisector of the connector, and also for a removable module. This model depicts the intermediate voltages for each modeled element within the power planes of both the module and the motherboard (again assuming a normalized 10 volt potential applied between the CPU footprint 150 on the module and the power terminal 126 on the motherboard power plane) for a one-ounce copper power plane and for 10 milliohm connector pins. Since this technique has been well described above, further comment is believed unnecessary, and the results for several cases similar to the power terminal configuration shown in FIG. 15 are described and summarized below.

Figure 16:
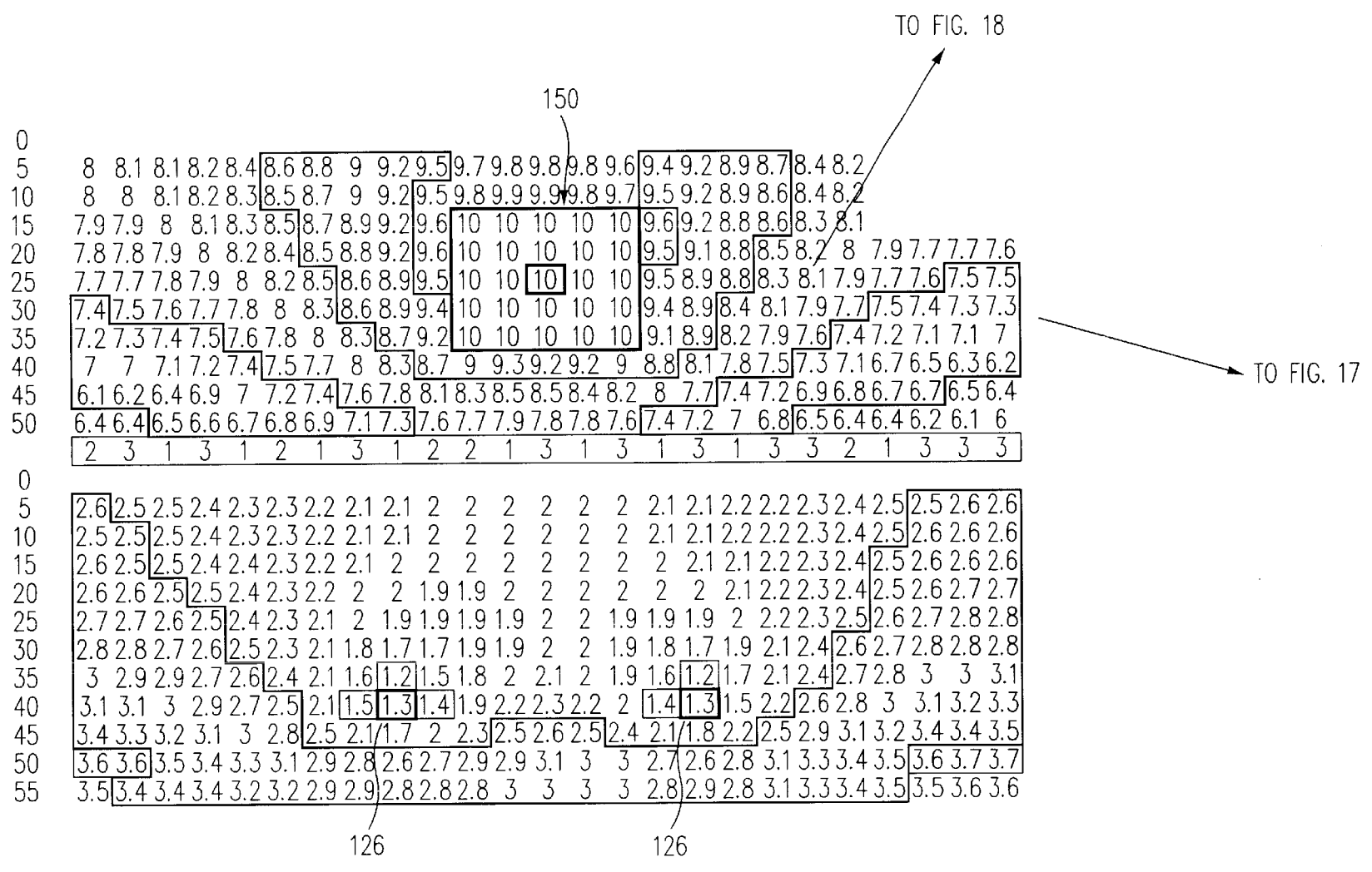
Figure 17:
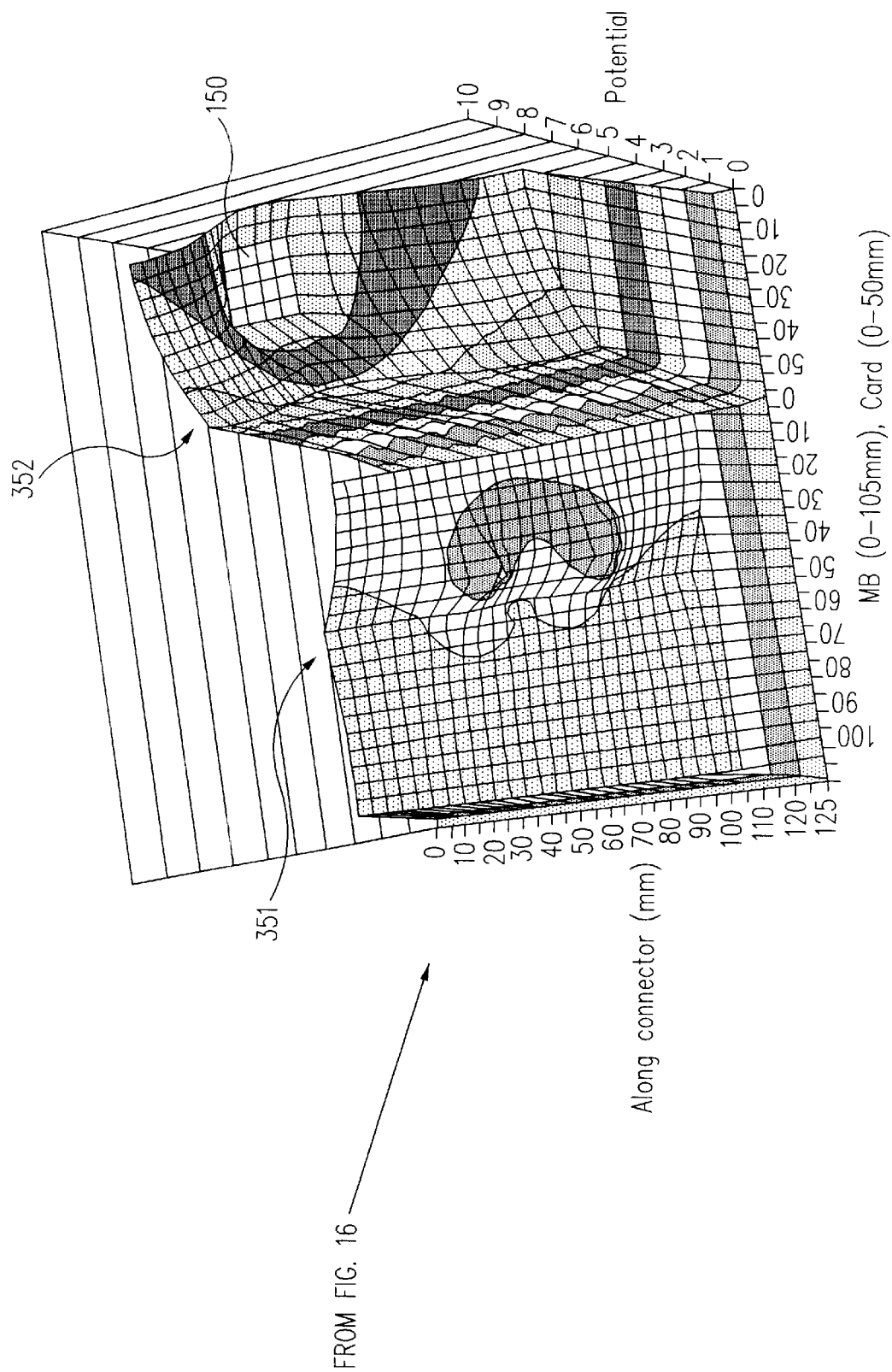
FIG. 17 is a three-dimensional chart illustrating the voltage of each element as calculated according to the model shown in FIG. 16.
Figure 19:
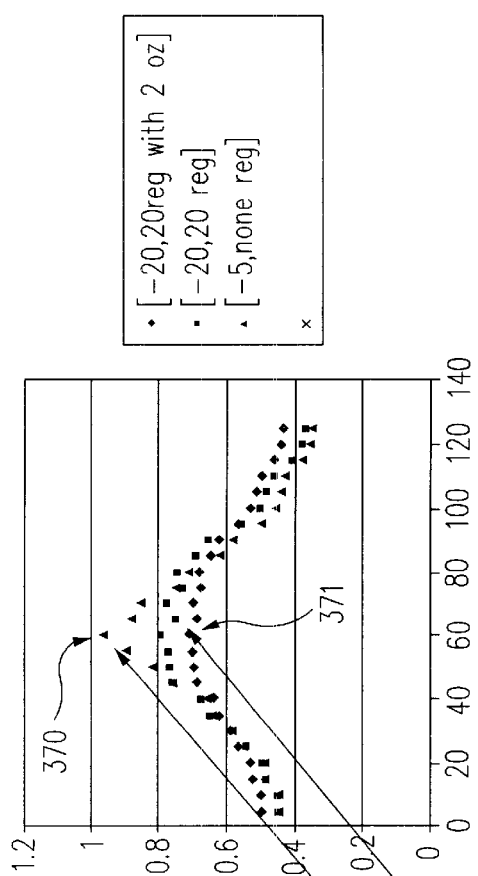
FIG. 19 is a two-dimensional chart illustrating the magnitude of current flow through each of the power pins of the motherboard connector for one of the values of the linear spacing between the power terminal(s) and the connector shown in FIG. 18.

FIG. 16 is a portion of a mathematical spreadsheet model for a motherboard power plane having a pair of symmetrically located power terminals, and for the removable module. The motherboard power plane has no cutouts, and each of the pair of symmetrically located power terminals is located a distance of 10 mm from the connector 144 and located a distance of 20 mm from the perpendicular bisector of the connector. This model depicts the intermediate voltages for each modeled element within the power planes of both the module and the motherboard, as before, for a normalized 10 volt potential applied between the CPU footprint 150 on the module and the power terminals 126 of the motherboard power plane, this time for a two-ounce copper power plane and 10 milliohm connector pins. While the voltages shown are informative, a graphical representation of these calculated voltage values is more easily appreciated and is shown in FIG. 17. As can be appreciated in the figure, the variation in voltage along the plateau 351 (corresponding to the row of connector pins) is quite substantially reduced compared to earlier examples, particularly those having only one power terminal to the motherboard power plane. The numeric values shown in the bottom row of FIG. 16 clarify this variation as ranging from a low of 2.8 volts to a high of 3.6 volts at the ends of the plateau 351. The low resistance of the power plane is partially responsible for this, but the effect of two power terminals is a larger contributor. Also quite apparent from FIG. 17 is the relative uniformity of the voltage across the connector edge 352 of the removable module. The low impedance of the connector pins generally is responsible for the relatively large voltage drop between the CPU footprint 150 and the connector edge 352, but the relatively low resistance of the two-ounce copper power planes tends to hold the extremes in voltage along the connector edge 352 to a narrower range than otherwise expected.

Figure 18:
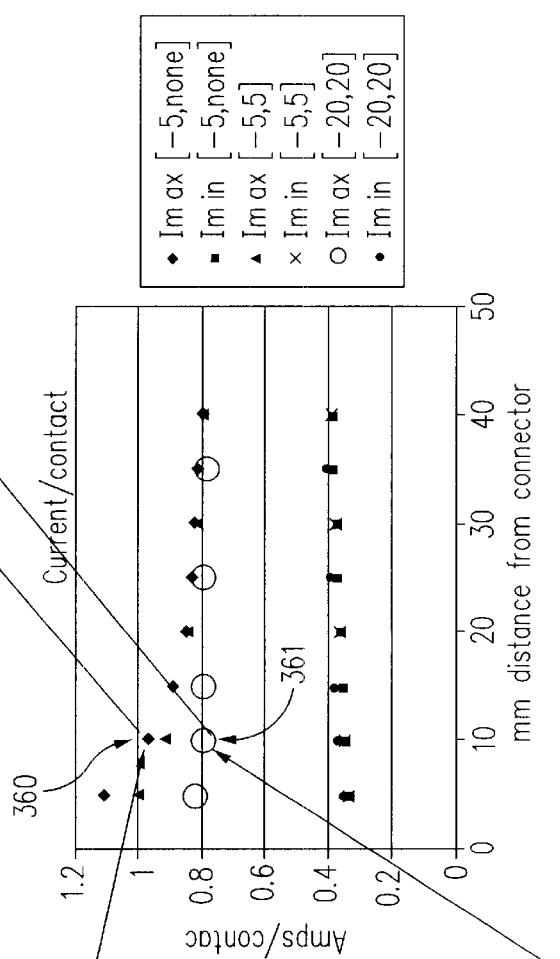
FIG. 18 is a two-dimensional chart illustrating the average current flow through the power pins of the motherboard connector for six different configurations of one or more power terminals (including those represented in FIG. 15 and in FIG. 16), each computed under 8 different values of the linear spacing between the power terminal(s) and the connector.

FIG. 18 is a two-dimensional chart illustrating the worst case current flow through the power pins of the motherboard connector (i.e., both the maximum and minimum pin current, labeled 'Imax' and 'Imin') for six different configurations of one or more power terminals (including those represented in FIG. 15 and in FIG. 16), with most configurations computed under 8 different values of the linear spacing between the power terminal(s) and the connector. The example shown in FIG. 15, which corresponds to a motherboard having a single power terminal located 5 mm from the perpendicular bisector of the connector and 10 mm from the connector (measured perpendicular to the connector) corresponds to data point 360. Other data points represented by diamonds correspond respectively to a connector-to-power terminal spacing of 5, 15, 20, 25, 30, 35, and 40 mm. As can be appreciated, the maximum connector pin current decreases as distance from the power terminal to the connector increases, and ranges from a high of 1.15 Amps (for a spacing of 5 mm) to a low of 0.8 Amps (for a spacing of 40 mm). The example shown in FIG. 16, which corresponds to a motherboard having a pair of power terminals, each located 20 mm from the perpendicular bisector of the connector and 10 mm from the connector (measured perpendicular to the connector), corresponds to data point 361. Other data points represented by circles correspond respectively to a connector-to-power terminal spacing of 5, 15, 25, and 35 mm. Here, the maximum connector pin current decreases ever so slightly as distance from the power terminal to the connector increases, at a value of essentially 0.8 Amps.

While the data graphed in FIG. 18 shows worst case current per connector pin, the individual connector pin currents may be computed as before (for each configuration) and the results graphed to highlight the variation in current per individual connector pin. Several selected examples are graphed in FIG. 19, which shows a two-dimensional chart illustrating the magnitude of current flow through each of the power pins of the motherboard connector for several configurations of the power terminal(s), each spaced 10 mm from the connector. The example shown in FIG. 15, which corresponds to a motherboard having a single power terminal located 5 mm from the perpendicular bisector of the connector and 10 mm from the connector, corresponds to data point 370. Other data points represented by triangles correspond respectively to the current per connector pin along the length of the connector for this configuration. The example shown in FIG. 16, which corresponds to a motherboard having a pair of power terminals, each located 20 mm from the perpendicular bisector of the connector and 10 mm from the connector, and having two-ounce power planes, corresponds to data point 371. Other data points represented by diamonds correspond respectively to the current per connector pin along the length of the connector for this configuration.

As the previous several figures show, the uniformity in current flow through each connector pin may be enhanced by utilizing more than one power terminal connected to the power plane within the motherboard, and particularly by using one (or more than one) pair of power terminals located symmetrically about the perpendicular bisector of the connector, preferably at a distance from the connector of at least 10–15 mm. For some combinations of parameters, a distance of 20–30 mm from the connector is even more beneficial.

Referring now to FIG. 20, a motherboard is illustrated having a connector 247 with a group of power supply pins 241 located off-center of the connector 247. A perpendicular bisector of the group of power pins 241 is labeled as 242. A first power plane 244 conveys a voltage to the first group of power pins 241. The voltage is provided to the power plane 244 by way of a power terminal 243 located on the perpendicular bisector of the first group of power pins 241. A second power plane 245 is shown formed in the same wiring layer of the motherboard, as well as unrelated interconnect features 246. In this particular example, the power plane 244 extends from the region around the power terminal 243 in a direction toward and encompassing the extent of the full connector 247, and generally extends no further, as any additional area of the power plane 244 beyond the area shown would contribute little to the current flow to the power pins of the connector 247.

Another example of a motherboard is shown in FIG. 21 which, as before, includes a first group of power pins 251 is located asymmetrically to the connector 256. A pair of power terminals 253, 254 are located symmetrically about the perpendicular bisector 252 of the group of power pins 251, and are also located a particular distance away from the connector 256. In this example, a single power plane 255 is shown which occupies fully the wiring layer in the vicinity near and around the connector 256.

In FIG. 22, an example of yet another motherboard is shown which illustrates a connector 264 having a group of power pins 260 generally uniformly distributed throughout the extent of the connector 264. In this case, the perpendicular bisector of the group of power pins 260 is also aligned at the same location as the perpendicular bisector of the connector itself and is labeled as dashed line 261. A pair of power terminals 262, 263 are each located a certain distance away from connector 264 and symmetrically about the perpendicular bisector 261.

FIG. 23 illustrates a motherboard having a connector 273 with two groups of power pins located generally at opposite ends of the connector. A first group of power pins 270 is located generally at the left end of the connector 273. A power terminal 274 is located along the perpendicular bisector 271 of the first group of power pins 270, and is located below the connector as shown. A second group of power pins 275 is located generally at the right end of the connector 273. A second power terminal 277 is located above the connector along the perpendicular bisector 276 of the second group of power pins 275.

FIG. 24 illustrates a motherboard having two connectors 280, 281 each of which has a group of power pins generally uniformly distributed throughout the connector. A perpendicular bisector of the connectors, labeled 282, is identical to a perpendicular bisector of the group of power pins. A pair of power terminals 283, 284 are located toward one side of connector 280, each spaced a certain distance from connector 280 and together symmetrically located on either side of the perpendicular bisector 282.

FIG. 25 illustrates a motherboard having two parallel connectors 290, 291 each having a group of power pins relatively uniformly distributed throughout the length of the connector. In this example, power terminals connected to the power plane are formed between the two connectors 290, 291. A perpendicular bisector 292 of both connectors is shown and a first pair of power terminals 293, 294 are spaced symmetrically on either side of the perpendicular bisector 292, and a second pair of power terminals 295, 296 are also located symmetrically about the perpendicular bisector 292 albeit at a closer distance to the perpendicular bisector 292 than the first pair of power terminals 293, 294. While the power terminals 293, 294, 295, 296 are shown generally midway between connectors 290 and 291, and while this may be preferred, such a midpoint spacing is not required.

Yet another example of a motherboard is shown in FIG. 26. In this example, two connectors 300, 301 are shown each having a group of power pins asymmetrically located toward one end of the connector. In particular, a first group of power pins 304 is located at the left end of connector end 300 and a second group of power pins 305 is located at the left end of connector 301, which is arranged parallel to connector 300. In this example, a perpendicular bisector line of both the group of power pins 304 and the group of power pins 305 are identical and is indicated by the dashed line labeled 306. A pair of power terminals 307, 308 provide a connection to a power plane 312 to which the group of power pins 304 and the group of power pins 305 are both connected. The power terminals 307, 308 are each located toward one side of connector 300 and are disposed a certain distance away from connector 300 indicated by the arrow labeled 311. Moreover, the power terminals 307, 308 are also located symmetrically about (and each located a distance 310 from) the perpendicular bisector 306. In this example, power plane 303 is shown providing a conductive path generally between the region of the power terminals 307, 308 and the region of the connectors 300, 301 within which the groups of power pins 304 and 305 are located. The power plane 303 does not extend beneath the entirety of connectors 300, 301. A second power plane 302 is also implemented on the same wiring layer as is power plane 303 for other uses within the motherboard power distribution arrangement.

While the invention has been largely described with respect to the embodiments set forth above, the invention is not necessarily limited to these embodiments, which are given by way of example only, and by no means represent an exhaustive set of illustrations. Variations and modifications of the embodiments disclosed herein may be made based on the description set forth herein, without departing from the scope and spirit of the invention as set forth in the following claims. For example, other kinds of electrical connectors may be used in addition to or in lieu of those depicted herein of the type usually associated with daughterboards, such as those used with memory modules, riser boards, backplane assemblies, and others. The invention is suitable for use with any application requiring a significant magnitude of current to be provided through most any electrical connector. Accordingly, other embodiments, variations, and improvements not described herein are not necessarily excluded from the scope of the invention, which is defined by the following appended claims.

What is claimed is:

1. An apparatus comprising:

a printed wiring board having a plurality of wiring layers for implementing electrical interconnections including conductive planes;

a connector attached to the printed wiring board for receiving a removable module and for providing electrical interconnections between the removable module and the printed wiring board, said connector having power pins connected to a conductive plane of the printed wiring board for communicating a voltage conveyed on the conductive plane to the removable module, wherein all of the power pins are provided in at least one group of power pins; and at least one power terminal connected to the conductive plane of the printed wiring board associated with each group of power pins of said at least one group of power pins, wherein said at least one power terminal associated with each group of power pins is positioned at respective locations generally symmetric to a line perpendicular to the connector and bisecting the respective group of power pins, for operably receiving the voltage.

2. An apparatus as recited in claim 1 wherein:

the line perpendicular to the connector and bisecting the respective group of power pins is offset from a perpendicular bisector of the connector.

3. An apparatus as recited in claim 1 wherein:

each of the at least one power terminals is either disposed at a location generally along the line perpendicular to the connector and bisecting the respective group of power pins, or is disposed, together with a corresponding paired power terminal, at a location symmetrical to the line perpendicular to the connector and bisecting the respective group of power pins.

4. An apparatus as recited in claim 1 wherein:
the line perpendicular to the connector and bisecting the respective group of power pins is generally aligned with a line perpendicular to and bisecting the connector, whereby the power terminal is disposed at a location generally along the line perpendicular to and bisecting the connector.

5. An apparatus as recited in claim 4 wherein:
the power pins of at least one group of power pins are generally uniformly spaced throughout the connector.

6. An apparatus as recited in claim 5 wherein:
each power terminal is either disposed at a location generally along the perpendicular bisector line of the connector, or is disposed, together with a corresponding paired power terminal, at a location symmetrical to the perpendicular bisector line of the connector.

7. An apparatus as recited in claim 6 wherein:
each power terminal is disposed at a certain distance from the connector.

8. An apparatus as recited in claim 7 wherein:
the certain distance from the connector comprises at least 15 mm.

9. An apparatus as recited in claim 4 wherein:
the power pins of at least one group of power pins are generally non-uniformly spaced throughout the connector.

10. An apparatus as recited in claim 1 wherein:
the conductive plane comprises a portion of a wiring layer of the printed wiring board, with other electrical interconnections formed in the same wiring layer.

11. An apparatus as recited in claim 1 wherein:
the printed wiring board includes at most four wiring layers.

12. An apparatus as recited in claim 1 wherein:
the conductive plane comprises substantially an entire wiring layer of the printed wiring board.

13. An apparatus as recited in claim 1 wherein:
the removable module comprises a CPU module.

14. An apparatus as recited in claim 1 wherein:
the removable module comprises a graphics processor module.

15. An apparatus as recited in claim 1 wherein:
the connector includes first and second groups of power pins.

16. An apparatus as recited in claim 1 wherein:
at least one power terminal comprises a wired connection to a power source external to the printed wiring board.

17. An apparatus as recited in claim 1 wherein:
at least one power terminal comprises an output terminal of a wiring board voltage regulator.

18. An apparatus as recited in claim 17 wherein:
the on-printed wiring board voltage regulator includes a single output terminal which connects to the conductive plane at a single power terminal.

19. An apparatus as recited in claim 17 wherein:
the wiring board voltage regulator includes multiple output terminals which respectively connect to the conductive plane at respective power terminals.

20. An apparatus as recited in claim 1 further comprising:
a second connector attached to the printed wiring board for receiving a second removable module and for providing electrical interconnections between the second removable module and the printed wiring board, said second connector having a first plurality of power pins connected to the conductive plane of the printed wiring board for communicating a power supply voltage conveyed on the conductive plane to the removable module; and
a power terminal connected to the conductive plane of the printed wiring board at a location generally along a line perpendicular to the second connector and bisecting its first plurality of power pins, for operably receiving the power supply voltage conveyed on the conductive plane.

21. An apparatus as recited in claim 20 wherein:
the second connector is disposed parallel to the first connector; and
at least one power terminal is disposed between the first and second connectors.

22. An apparatus as recited in claim 20 wherein:
the second connector is disposed parallel to the first connector; and
at least one power terminal is disposed on a side of the first connector opposite the second connector.

23. In a printed wiring board having at least one wiring layer for implementing electrical interconnections including conductive planes, and having a connector attached to the printed wiring board for receiving a removable module and for providing electrical interconnections between the removable module and the printed wiring board, said connector having power pins connected to a conductive plane of the printed wiring board for communicating a voltage conveyed on the conductive plane to the removable module, all of said power pins being provided in at least one group of power pins, said printed wiring board further having at least one power terminal associated with each group of power pins of said at least one group of power pins, connected to the conductive plane of the printed wiring board for operably receiving the voltage, a method for reducing the difference in current flow between power pins of the connector having the highest current flow and power pins of the connector having the lowest current flow, said method comprising the steps of:
locating the at least one power terminal at respective locations on the printed wiring board generally symmetric to a line perpendicular to the connector and bisecting its respective group of power pins.

24. A method as recited in claim 23 wherein:
the line perpendicular to the connector and bisecting the respective group of power pins is offset from a perpendicular bisector of the connector.

25. A method as recited in claim 23 further comprising the steps of:
locating each of the at least one power terminals either at a location generally along the line perpendicular to the connector and bisecting the respective group of power pins, or, together with a corresponding paired power terminal, at a location symmetrical to the line perpendicular to the connector and bisecting the respective group of power pins.

26. A method as recited in claim 23 wherein:
the line perpendicular to the connector and bisecting the respective group of power pins is generally aligned with a line perpendicular to and bisecting the connector, whereby the power terminal is disposed at a location generally along the line perpendicular to and bisecting the connector.

27. A method as recited in claim 26 wherein:
the power pins of at least one group of power pins are generally uniformly spaced throughout the connector.

28. A method as recited in claim 27 further comprising the steps of:

locating each power terminal either at a location generally along the perpendicular bisector line of the connector, or, together with a corresponding paired power terminal, at a location symmetrical to the perpendicular bisector line of the connector.

29. A method as recited in claim 28 further comprising the steps of:

locating each power terminal connected to the conductive plane of the printed wiring board a certain distance from the connector.

30. A method as recited in claim 29 wherein:

the certain distance from the connector comprises at least 15 mm.

31. A method as recited in claim 26 wherein:

the power pins of at least one group of power pins are generally non-uniformly spaced throughout the connector.

32. A method as recited in claim 23 further comprising the steps of:

forming other electrical interconnections in the same wiring layer as the conductive plane is formed within.

33. A method as recited in claim 23 further comprising the steps:

providing the printed wiring board with at most four wiring layers.

34. A method as recited in claim 23 further comprising the steps of:

forming the conductive plane in substantially an entire wiring layer of the printed wiring board.

35. A method as recited in claim 23 wherein:

the removable module comprises a CPU module.

36. A method as recited in claim 23 wherein:

the removable module comprises a graphics processor module.

37. A method as recited in claim 23 wherein:

the connector includes first and second group of power pins.

38. A method as recited in claim 23 wherein:

at least one power terminal comprises a wired connection to a power source external to the printed wiring board.

39. A method as recited in claim 23 wherein:

at least one power terminal comprises an output terminal of voltage regulator on the printed wiring board.

40. A method as recited in claim 39 wherein:

the voltage regulator on the printed wiring board includes a single output terminal which connects to the conductive plane at a single power terminal.

41. A method as recited in claim 39 wherein:

the voltage regulator on the printed wiring board includes multiple output terminals which respectively connect to the conductive plane at respective power terminals.

42. A method as recited in claim 23 further comprising the steps of:

providing a second connector attached to the printed wiring board for receiving a second removable module and for providing electrical interconnections between the second removable module and the printed wiring board, said second connector having a first plurality of power pins connected to the conductive plane of the printed wiring board for communicating a power supply voltage conveyed on the conductive plane to the removable module; and locating a power terminal connected to the conductive plane of the printed wiring board generally along a line perpendicular to the second connector and bisecting its first plurality of power pins, for operably receiving the power supply voltage conveyed on the conductive plane.

43. A method as recited in claim 42 further comprising the steps of:

locating the second connector in an orientation parallel to the first connector; and locating at least one power terminal between the first and second connectors.

44. A method as recited in claim 42 further comprising the steps of:

locating the second connector in an orientation parallel to the first connector; and locating at least one power terminal on a side of the first connector opposite the second connector.

45. An apparatus comprising:

a printed wiring board having a plurality of wiring layers for implementing electrical interconnections including conductive planes;

a connector attached to the printed wiring board for receiving a removable module and for providing electrical interconnections between the removable module and the printed wiring board, said connector having a first plurality of power pins connected to a conductive plane of the printed wiring board for communicating a particular voltage conveyed on the conductive plane to the removable module; and first and second power terminals connected to the conductive plane of the printed wiring board at respective locations generally symmetric to a line perpendicular to the connector and bisecting the first plurality of power pins, for operably receiving the particular voltage, wherein the first and second terminals are spaced apart from said line along a direction perpendicular to said line.

* * * * *